(12) United States Patent
Lee et al.

(10) Patent No.: US 12,520,649 B2
(45) Date of Patent: Jan. 6, 2026

(54) DISPLAY DEVICE

(71) Applicant: Samsung Display Co., LTD., Yongin-si (KR)

(72) Inventors: Ji Young Lee, Yongin-si (KR); Hae Ryeong Park, Yongin-si (KR); Hyun Young Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 408 days.

(21) Appl. No.: 18/165,808

(22) Filed: Feb. 7, 2023

(65) Prior Publication Data

US 2023/0317767 A1  Oct. 5, 2023

(30) Foreign Application Priority Data

Mar. 30, 2022  (KR) .................. 10-2022-0039864

(51) Int. Cl.
*H10H 29/14* (2025.01)
*H10H 20/821* (2025.01)
*H10H 20/84* (2025.01)

(52) U.S. Cl.
CPC ........ *H10H 29/142* (2025.01); *H10H 20/821* (2025.01); *H10H 20/84* (2025.01)

(58) Field of Classification Search
None
See application file for complete search history.

(56) References Cited

U.S. PATENT DOCUMENTS 9,761,801 B2  9/2017  Kang
2022/0052032 A1*  2/2022  Li ..................... H10D 86/0231
2022/0059609 A1*  2/2022  Song ..................... H10H 20/84

FOREIGN PATENT DOCUMENTS

KR  10-2052331 B1  12/2019

* cited by examiner

*Primary Examiner* — Nicholas J Tobergte
(74) *Attorney, Agent, or Firm* — Womble Bond Dickinson (US) LLP

(57) ABSTRACT

A display device is provided. The display device includes pixels, electrodes in an emission area of the pixels, and spaced apart from each other, light emitting elements between the electrodes, connection electrodes on the light emitting elements, and including a first electrode portion, a second electrode portion, and a connection portion between the first electrode portion and the second electrode portion, and a bank pattern in a non-emission area, and overlapping the connection portion.

19 Claims, 15 Drawing Sheets

DISPLAY DEVICE

CROSS-REFERENCE TO RELATED APPLICATION

This application claims priority to, and the benefit of, Korean Patent Application No. 10-2022-0039864, filed on Mar. 30, 2022, and all the benefits accruing therefrom under 35 U.S.C. § 119, the content of which in its entirety is herein incorporated by reference.

BACKGROUND

1. Field

The disclosure relates to a display device.

2. Description of the Related Art

Recently, as interest in an information display is increasing, research and development for a display device are continuously being conducted.

SUMMARY

The present disclosure provides a display device capable of reducing or minimizing disconnection or a short circuit defect due to aggregation of light emitting elements.

The disclosure is not limited to the above, and other aspects which are not described will be clearly understood by those skilled in the art from the following description.

According to one or more embodiments of the disclosure, a display device includes pixels, electrodes in an emission area of the pixels, and spaced apart from each other, light emitting elements between the electrodes, connection electrodes on the light emitting elements, and including a first electrode portion, a second electrode portion, and a connection portion between the first electrode portion and the second electrode portion, and a bank pattern in a non-emission area, and overlapping the connection portion.

The emission area may include a first emission area and a second emission area, wherein the non-emission area is between the first emission area and the second emission area.

The light emitting elements may include a first light emitting element in the first emission area, and a second light emitting element in the second emission area.

The first electrode portion may be electrically connected to the first light emitting element, wherein the second electrode portion is electrically connected to the second light emitting element.

The first electrode portion may overlap the first emission area, wherein the second electrode portion overlaps the second emission area.

The display device may further include a first bank surrounding the emission area.

A thickness of the first bank may be greater than a thickness of the bank pattern.

The first bank may be between the pixels.

The first bank and the bank pattern may be in a same layer.

The first bank and the bank pattern may be integrally provided.

The first electrode portion, the second electrode portion, and the connection portion may be integrally provided.

According to one or more embodiments of the disclosure, a display device includes a first light emitting element in a first emission area, a second light emitting element in a second emission area, a first bank pattern between the first emission area and the second emission area, a first electrode portion on the first light emitting element, a second electrode portion on the second light emitting element, and a connection portion between the first electrode portion and the second electrode portion, and overlapping the first bank pattern.

The display device may further include a first bank surrounding the first emission area and the second emission area.

A thickness of the first bank may be greater than a thickness of the first bank pattern.

The display device may further include a second bank pattern between the first bank and the first emission area.

A thickness of the first bank pattern and a thickness of the second bank pattern may be the same.

A thickness of the first bank may be greater than a thickness of the second bank pattern.

The first bank pattern and the second bank pattern may be in a same layer.

The first bank pattern and the second bank pattern may include a same material.

The display device may further include a third bank pattern between the first bank and the second emission area.

According to the above-described embodiments, by forming the bank pattern in the non-emission area, a phenomenon in which the light emitting elements are provided in the non-emission area and are aggregated may be reduced or prevented. Therefore, because disconnection or a short circuit defect due to the aggregation of the light emitting elements may be reduced or minimized, a dark spot defect of the pixel may be improved.

Aspects of the embodiments are not limited by the contents illustrated above, and various other aspects are included in the present specification.

BRIEF DESCRIPTION OF THE DRAWINGS

The above and other aspects of the disclosure will become more apparent by describing in further detail embodiments thereof with reference to the accompanying drawings, in which.

DETAILED DESCRIPTION

Figure 1:
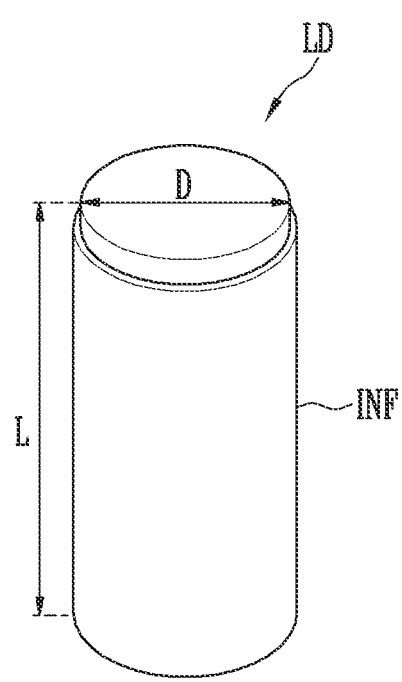
FIG. 1 is a perspective view illustrating a light emitting element according to one or more embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components such as "between,"

"immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, "or" generally means "and/or," and the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

When one or more embodiments may be implemented differently, a specific process order may be performed differently from the described order. For example, two consecutively described processes may be performed substantially at the same time or performed in an order opposite to the described order.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
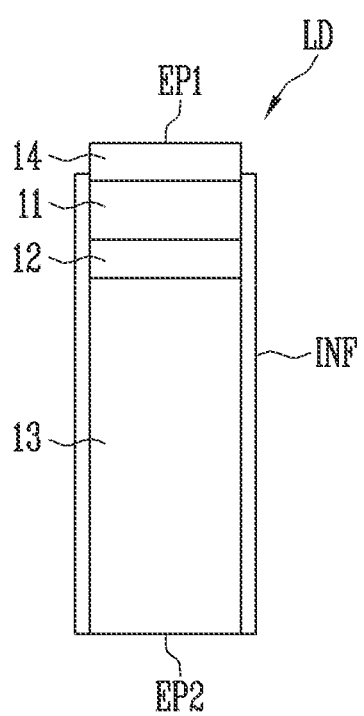
FIG. 2 is a cross-sectional view illustrating a light emitting element according to one or more embodiments.

FIG. 1 is a perspective view illustrating a light emitting element according to one or more embodiments. FIG. 2 is a cross-sectional view illustrating a light emitting element according to one or more embodiments. FIGS. 1 and 2 show a column shape light emitting element LD, but a type and/or a shape of the light emitting element LD are/is not limited thereto.

Referring to FIGS. 1 and 2, the light emitting element LD may include a first semiconductor layer 11, an active layer 12, a second semiconductor layer 13, and/or an electrode layer 14.

The light emitting element LD may be formed in a column shape extending along one direction. The light emitting element LD may have a first end EP1 and a second end EP2. One of the first and second semiconductor layers 11 and 13 may be located at the first end EP1 of the light emitting element LD. The other of the first and second semiconductor layers 11 and 13 may be located at the second end EP2 of the light emitting element LD. For example, the first semiconductor layer 11 may be located at the first end EP1 of the light emitting element LD, and the second semiconductor layer 13 may be located at the second end EP2 of the light emitting element LD.

According to one or more embodiments, a light emitting element LD may be a light emitting element manufactured in a column shape through an etching method or the like. In the present specification, the column shape includes a rod-like shape or a bar-like shape of which an aspect ratio is greater than 1, such as a circular column or a polygonal column, and the shape of the cross-section thereof is not limited.

The light emitting element LD may have a size as small as a nanometer scale to a micrometer scale. For example, each light emitting element LD may have a diameter D (or width) and/or a length L of a nanometer scale to micrometer scale range. However, a size of the light emitting element LD is not limited thereto, and the size of the light emitting element LD may be variously changed according to a design condition of various devices using a light emitting device using the light emitting element LD as a light source, for example, a display device or the like.

The first semiconductor layer 11 may be a semiconductor layer of a first conductivity type. For example, the first semiconductor layer 11 may include a p-type semiconductor layer. For example, the first semiconductor layer 11 may include at least one semiconductor material among InAlGaN, GaN, AlGaN, InGaN, or AlN, and may include a p-type semiconductor layer doped with a first conductivity type dopant such as Mg. However, the material configuring the first semiconductor layer 11 is not limited thereto, and various other materials may configure the first semiconductor layer 11.

The active layer 12 may be located between the first semiconductor layer 11 and the second semiconductor layer 13. The active layer 12 may include any one of a single well structure, a multi well structure, a single quantum well structure, a multi quantum well (MQW) structure, a quantum dot structure, or a quantum wire structure, but is not limited thereto. The active layer 12 may include GaN, InGaN, InAlGaN, AlGaN, or AlN, and various other materials may configure the active layer 12.

When a voltage equal to or greater than a threshold voltage is applied to both ends of the light emitting element LD, an electron-hole pair is combined in the active layer 12 and thus the light emitting element LD emits light. By controlling emission of the light emitting element LD using such a principle, the light emitting element LD may be used as a light source of various light emitting devices including a pixel of a display device.

The second semiconductor layer 13 may be located on the active layer 12 and may include a semiconductor layer of a type different from that of the first semiconductor layer 11. The second semiconductor layer 13 may include an n-type semiconductor layer. For example, the second semiconductor layer 13 may include any one semiconductor material among InAlGaN, GaN, AlGaN, InGaN, and AlN, and may include an n-type semiconductor layer doped with a second conductivity type dopant such as phosphorus Si, Ge, and Sn. However, the material configuring the second semiconductor layer 13 is not limited thereto, and the second semiconductor layer 13 may be configured of various other materials.

The electrode layer 14 may be located on the first end EP1 and/or the second end EP2 of the light emitting element LD. FIG. 2 illustrates a case in which the electrode layer 14 is formed on the first semiconductor layer 11, but the disclosure is not limited thereto. For example, a separate contact electrode may be further located on the second semiconductor layer 13.

The electrode layer 14 may include a transparent metal or a transparent metal oxide. For example, the electrode layer 14 may include at least one of indium tin oxide (ITO), indium zinc oxide (IZO), and zinc tin oxide (ZTO), but is not limited thereto. As described above, when the electrode layer 14 is formed of the transparent metal or the transparent metal oxide, light generated in the active layer 12 of the light emitting element LD may pass through the electrode layer 14 and may be emitted to the outside of the light emitting element LD.

An insulating layer INF may be provided on a surface of the light emitting element LD. The insulating film INF may be directly located on a surface of the first semiconductor layer 11, the active layer 12, the second semiconductor layer 13, and/or the electrode layer 14. The insulating film INF may expose the first and second ends EP1 and EP2 of the light emitting element LD having different polarities. According to one or more embodiments, the insulating film INF may expose a side portion of the electrode layer 14 and/or the second semiconductor layer 13 adjacent to the first and second ends EP1 and EP2 of the light emitting element LD.

The insulating layer INF may reduce or prevent the likelihood of an electrical short that may occur when the active layer 12 comes into contact with a conductive material except for the first and second semiconductor layers 11 and 13. In addition, the insulating layer INF may reduce or minimize a surface defect of the light emitting elements LD, thereby improving lifespan and emission efficiency of the light emitting elements LD.

The insulating film INF may include at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$). For example, the insulating film INF may be configured of a double layer, and each layer configuring the double layer may include different materials. For example, the insulating film INF may be configured of a double layer configured of aluminum oxide ($AlO_x$) and silicon oxide ($SiO_x$), but is not limited thereto. According to one or more embodiments, the insulating film INF may be omitted.

A light emitting device including the light emitting element LD described above may be used in various types of devices that suitably use a light source, including a display device. For example, a plurality of light emitting elements LD may be located in each pixel of a display panel, and the light emitting elements LD may be used as a light source of each pixel. However, an application field of the light emitting element LD is not limited to the above-described example. For example, the light emitting element LD may also be used in other types of devices that suitably use a light source, such as a lighting device.

Figure 3:
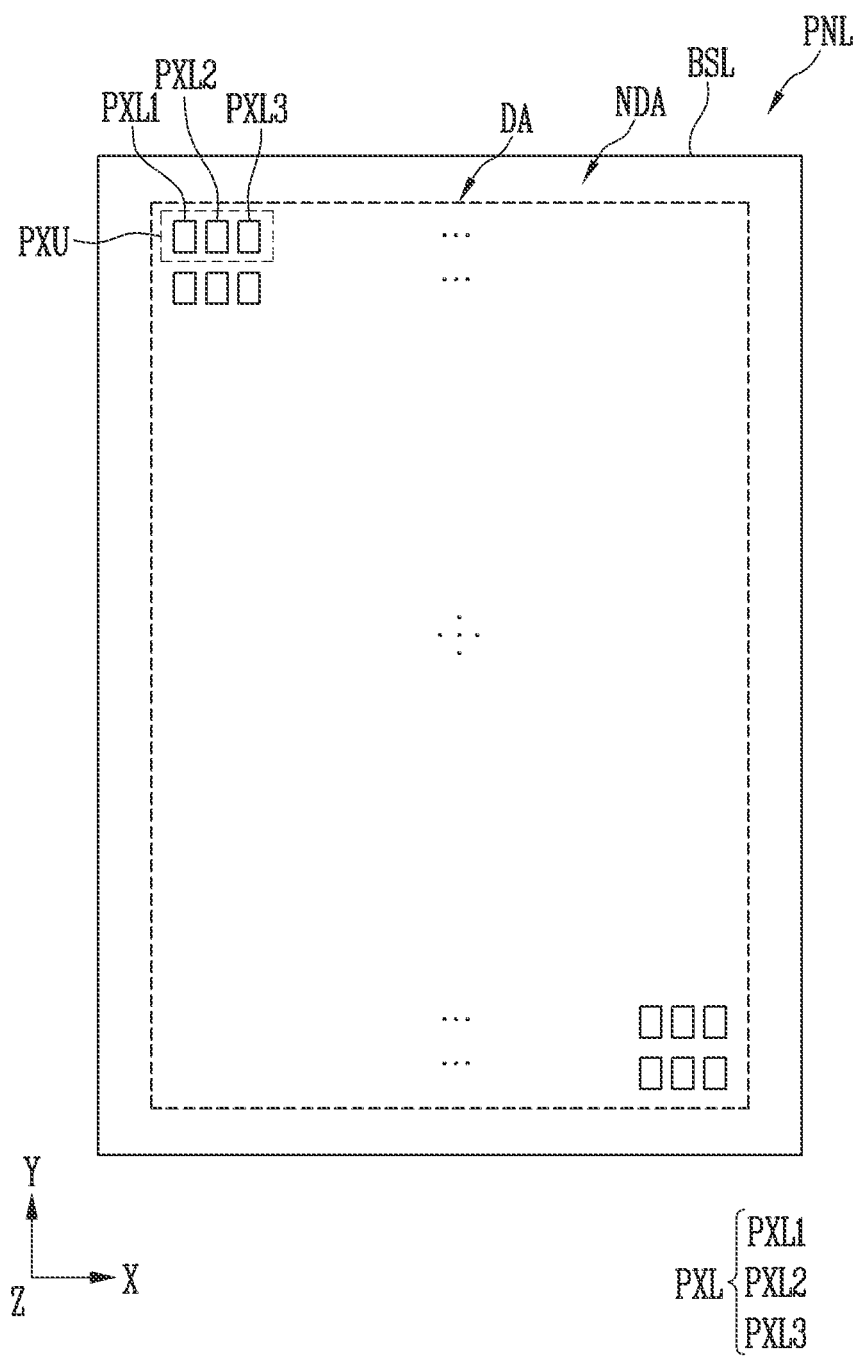
FIG. 3 is a plan view illustrating a display device according to one or more embodiments.

FIG. 3 is a plan view illustrating a display device according to one or more embodiments.

In FIG. 3, as an example of an electronic device that may use the light emitting element LD described in the embodiments of FIGS. 1 and 2 as a light source, a display device, for example, a display panel PNL provided in the display device is shown.

For convenience of description, in FIG. 3, a structure of the display panel PNL is briefly shown based on a display area DA. However, according to one or more embodiments, at least one driving circuit unit (for example, at least one of a scan driver and a data driver), lines, and/or pads, which are/is not shown, may be further located on the display panel PNL.

Referring to FIG. 3, the display panel PNL, and a base layer BSL for forming the same, may include the display area DA for displaying an image, and a non-display area NDA excluding the display area DA. The display area DA may configure a screen on which the image is displayed, and the non-display area NDA may be an area except for the display area DA.

A pixel unit PXU may be located in the display area DA. The pixel unit PXU may include a first pixel PXL1, a second pixel PXL2, and/or a third pixel PXL3. Hereinafter, when at least one pixel among the first pixel PXL1, the second pixel PXL2, and the third pixel PXL3 is arbitrarily referenced, or when two or more types of pixels are collectively referenced, the at least one pixel or the two or more types of pixels are referred to as a "pixel PXL" or "pixels PXL."

The pixels PXL may be regularly arranged according to a stripe or PENTILE™ arrangement structure, or the like (e.g., a RGBG matrix structure, a PENTILE™ matrix structure, a PENTILE™ structure, or an RGBG structure, PENTILE™ being a registered trademark of Samsung Display Co., Ltd., Republic of Korea). However, the arrangement structure of the pixels PXL is not limited thereto, and the pixels PXL may be arranged in the display area DA in various structures and/or methods.

According to one or more embodiments, two or more types of pixels PXL for emitting light of different colors may be located in the display area DA. For example, in the display area DA, the first pixels PXL1 emitting light of a first color, the second pixels PXL2 emitting light of a second color, and the third pixels PXL3 emitting light of a third color may be arranged. At least one of the first to third pixels PXL1, PXL2, and PXL3 arranged to be adjacent to each other may configure one pixel unit PXU capable of emitting light of various colors. For example, each of the first to third pixels PXL1, PXL2, and PXL3 may be a pixel for emitting light of a color (e.g., predetermined color). According to one or more embodiments, the first pixel PXL1 may be a red pixel for emitting red light, the second pixel PXL2 may be a green pixel for emitting green light, and the third pixel PXL3 may be a blue pixel for emitting blue light, but are not limited thereto.

In one or more embodiments, the first pixel PXL1, the second pixel PXL2, and the third pixel PXL3 may include light emitting elements that emit light of the same color, and may include a color conversion layer and/or a color filter layer of different colors located on the respective light emitting element to emit light of the first color, the second color, and the third color, respectively. In one or more other embodiments, the first pixel PXL1, the second pixel PXL2, and the third pixel PXL3 may include a light emitting element of the first color, a light emitting element of the second color, and a light emitting element of the third color as a light source to emit light of the first color, the second color, and the third color, respectively. However, the color, type, number, and/or the like of the pixels PXL configuring each pixel unit PXU are/is not particularly limited. That is, the color of light emitted by each pixel PXL may be variously changed.

The pixel PXL may include at least one light source driven by a control signal (e.g., predetermined control signal, for example, a scan signal and a data signal) and/or power (e.g., predetermined power, for example, first power and second power). In one or more embodiments, the light source may include at least one light emitting element LD according to any one of the embodiments of FIGS. 1 and 2, for example, an ultra-small column shape light emitting elements LD having a size as small as a nanometer scale to a micrometer scale. However, the disclosure is not limited thereto, and various types of light emitting elements LD may be used as the light source of the pixel PXL.

In one or more embodiments, each pixel PXL may be configured as an active pixel. However, a type, a structure, and/or a driving method of the pixel PXL applicable to the display device are/is not particularly limited. For example, each pixel PXL may be configured as a pixel of a passive or active light emitting display device of various structures and/or driving methods.

Figure 4:
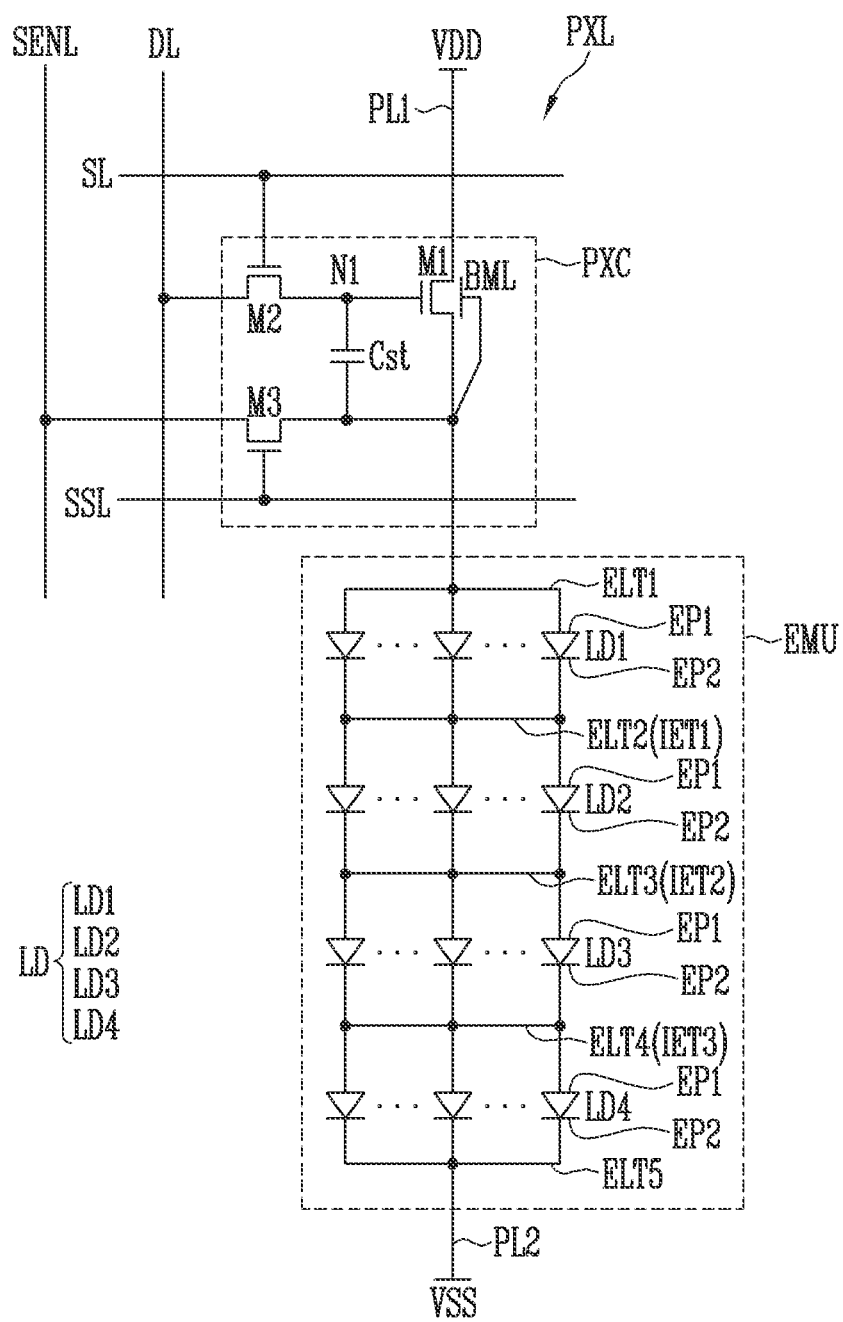
FIG. 4 is a circuit diagram illustrating a pixel according to one or more embodiments.

FIG. 4 is a circuit diagram illustrating a pixel according to one or more embodiments.

The pixel PXL shown in FIG. 4 may be any one of the first pixel PXL1, the second pixel PXL2, and the third pixel PXL3 provided in the display panel PNL of FIG. 3. The first pixel PXL1, the second pixel PXL2, and the third pixel PXL3 may have structures substantially identical or similar to each other.

Referring to FIG. 4, each pixel PXL may further include a light emitting unit EMU for generating light of a luminance corresponding to a data signal, and a pixel circuit PXC for driving the light emitting unit EMU.

The pixel circuit PXC may be connected between first power VDD and the light emitting unit EMU. In addition, the pixel circuit PXC may be connected to a scan line SL and a data line DL of the corresponding pixel PXL, and may control an operation of the light emitting unit EMU in response to a scan signal and a data signal supplied from the scan line SL and the data line DL. In addition, the pixel circuit PXC may be further selectively connected to a sensing signal line SSL and a sensing line SENL.

The pixel circuit PXC may include at least one transistor and a capacitor. For example, the pixel circuit PXC may include a first transistor M1, a second transistor M2, a third transistor M3, and a storage capacitor Cst.

The first transistor M1 may be connected between the first power VDD and a first connection electrode ELT1. A gate electrode of the first transistor M1 may be connected to a first node N1. The first transistor M1 may control a driving current supplied to the light emitting unit EMU in response to a voltage of the first node N1. That is, the first transistor M1 may be a driving transistor that controls the driving current of the pixel PXL.

In one or more embodiments, the first transistor M1 may selectively include a lower conductive layer BML (also referred to as a "lower electrode," a "back gate electrode," or a "lower light-blocking layer"). The gate electrode of the first transistor M1 and the lower conductive layer BML may overlap each other with an insulating layer interposed therebetween. In one or more embodiments, the lower conductive layer BML may be connected to one electrode of the first transistor M1, for example, a source or drain electrode.

In a case where the first transistor M1 includes the lower conductive layer BML, when driving the pixel PXL, a back-biasing technology (or sync technology) of moving a threshold voltage of the first transistor M1 in a negative direction or a positive direction by applying a back-biasing voltage to the lower conductive layer BML of the first transistor M1 may be applied. For example, the threshold voltage of the first transistor M1 may move in the negative direction or the positive direction by applying a source-sync technology by connecting the lower conductive layer BML to the source electrode of the first transistor M1. In addition, when the lower conductive layer BML is located under a semiconductor pattern configuring a channel of the first transistor M1, the lower conductive layer BML may serve as a light-blocking pattern and may stabilize an operation characteristic of the first transistor M1. However, a function and/or a utilization method of the lower conductive layer BML are/is not limited thereto.

The second transistor M2 may be connected between the data line DL and the first node N1. In addition, a gate electrode of the second transistor M2 may be connected to the scan line SL. The second transistor M2 may be turned on when a scan signal of a gate-on voltage (for example, a high level voltage) is supplied from the scan line SL to electrically connect the data line DL and the first node N1.

For each frame period, a data signal of a corresponding frame may be supplied to the data line DL, and the data signal may be transmitted to the first node N1 through the turned on second transistor M2 during a period in which the scan signal of the gate-on voltage is supplied. That is, the second transistor M2 may be a switching transistor for transmitting each data signal to the inside of the pixel PXL.

One electrode of the storage capacitor Cst may be connected to the first node N1, and another electrode thereof may be connected to the second electrode of the first transistor M1. The storage capacitor Cst may charge a voltage corresponding to the data signal supplied to the first node N1 during each frame period.

The third transistor M3 may be connected between the first connection electrode ELT1 (or the second electrode of the first transistor M1) and the sensing line SENL. A gate electrode of the third transistor M3 may be connected to the sensing signal line SSL. The third transistor M3 may transmit a voltage value applied to the first connection electrode ELT1 to the sensing line SENL according to a sensing signal supplied to the sensing signal line SSL. The voltage value transmitted through the sensing line SENL may be provided to an external circuit (for example, a timing controller), and the external circuit may extract characteristic information (for example, the threshold voltage or the like of the first transistor M1) of each pixel PXL based on the provided voltage value. The extracted characteristic information may be used to convert image data so that a characteristic deviation between the pixels PXL is compensated.

Meanwhile, in FIG. 4, all transistors included in the pixel circuit PXC are n-type transistors, but are not limited thereto. For example, at least one of the first, second, and third transistors M1, M2, and M3 may be changed to a p-type transistor.

In addition, a structure and a driving method of the pixel PXL may be variously changed. For example, the pixel circuit PXC may be configured of a pixel circuit of various structures and/or driving methods, in addition to the embodiments corresponding to FIG. 4.

For example, the pixel circuit PXC may not include the third transistor M3. In addition, the pixel circuit PXC may additionally include at least one or more other circuit elements such as a compensation transistor for compensating for the threshold voltage or the like of the first transistor M1, an initialization transistor for initializing the voltage of the first node N1 and/or the first electrode ELT1, an emission control transistor for controlling a period in which the driving current is supplied to the light emitting unit EMU, and/or a boosting capacitor for boosting the voltage of the first node N1.

The light emitting unit EMU may include at least one light emitting element LD, for example, a plurality of light emitting elements LD, connected between the first power VDD and second power VSS.

For example, the light emitting unit EMU may include the first connection electrode ELT1 connected to the first power VDD through the pixel circuit PXC and a first power line PL1, a fifth connection electrode ELT5 connected to the second power VSS through a second power line PL2, and the plurality of light emitting elements LD connected between the first and fifth connection electrodes ELT1 and ELT5.

The first power VDD and the second power VSS may have different potentials so that the light emitting elements LD may emit light. For example, the first power VDD may be set as a high potential power, and the second power VSS may be set as a low potential power.

In one or more embodiments, the light emitting unit EMU may include at least one series stage. Each series stage may include a pair of electrodes (for example, two electrodes) and at least one light emitting element LD connected in a forward direction between the pair of electrodes. Here, the number of series stages configuring the light emitting unit EMU and the number of light emitting elements LD configuring each series stage are not particularly limited. For example, the number of light emitting elements LD configuring each series stage may be the same or different from each other, and the number of the light emitting elements LD is not particularly limited.

For example, the light emitting unit EMU may include a first series stage including at least one first light emitting element LD1, a second series stage including at least one second light emitting element LD2, a third series stage including at least one third light emitting element LD3, and a fourth series stage including at least one fourth light emitting element LD4.

The first series stage may include the first connection electrode ELT1, a second connection electrode ELT2, and at least one first light emitting element LD1 connected between the first and second connection electrodes ELT1 and ELT2. Each first light emitting element LD1 may be connected in a forward direction between the first and second connection electrodes ELT1 and ELT2. For example, the first end EP1 of the first light emitting element LD1 may be connected to the first connection electrode ELT1, and the second end EP2 of the first light emitting element LD1 may be connected to the second connection electrode ELT2.

The second series stage may include the second connection electrode ELT2, the third connection electrode ELT3, and at least one second light emitting element LD2 connected between the second and third connection electrodes ELT2 and ELT3. Each second light emitting element LD2 may be connected in the forward direction between the second and third connection electrodes ELT2 and ELT3. For example, the first end EP1 of the second light emitting element LD2 may be connected to the second connection electrode ELT2, and the second end EP2 of the second light emitting element LD2 may be connected to the third connection electrode ELT3.

The third series stage may include the third connection electrode ELT3, a fourth connection electrode ELT4, and at least one third light emitting element LD3 connected between the third and fourth connection electrodes ELT3 and ELT4. Each third light emitting element LD3 may be connected in a forward direction between the third and fourth connection electrodes ELT3 and ELT4. For example, the first end EP1 of the third light emitting element LD3 may be connected to the third connection electrode ELT3, and the second end EP2 of the third light emitting element LD3 may be connected to the fourth connection electrode ELT4.

The fourth series stage may include the fourth connection electrode ELT4, the fifth connection electrode ELT5, and at least one fourth light emitting element LD4 connected between the fourth and fifth connection electrodes ELT4 and ELT5. Each fourth light emitting element LD4 may be connected in a forward direction between the fourth and fifth connection electrodes ELT4 and ELT5. For example, the first end EP1 of the fourth light emitting element LD4 may be connected to the fourth connection electrode ELT4, and the second end EP2 of the fourth light emitting element LD4 may be connected to the fifth connection electrode ELT5.

A first electrode of the light emitting unit EMU, for example, the first connection electrode ELT1, may be an anode electrode of the light emitting unit EMU. A last electrode of the light emitting unit EMU, for example, the fifth connection electrode ELT5, may be a cathode electrode of the light emitting unit EMU.

A remaining electrode(s) of the light emitting unit EMU, for example, the second connection electrode ELT2, the third connection electrode ELT3, and/or the fourth connection electrode ELT4 may configure each intermediate electrode. For example, the second connection electrode ELT2 may configure a first intermediate electrode IET1, the third connection electrode ELT3 may configure a second intermediate electrode IET2, and the fourth connection electrode ELT4 may configure a third intermediate electrode IET3.

When the light emitting elements LD are connected in a series/parallel structure, power efficiency may be improved compared to a case where the same number of light emitting elements LD are connected only in parallel. In addition, in the pixel PXL in which the light emitting elements LD are connected in the series/parallel structure, because a luminance (e.g., predetermined luminance) may be expressed through the light emitting elements LD of a remaining series stage even though a short defect or the like occurs at some of the series stages, a possibility of a dark spot defect of the pixel PXL may be reduced. However, the disclosure is not limited thereto, and the light emitting unit EMU may be configured by connecting the light emitting elements LD only in series, or the light emitting unit EMU may be configured by connecting the light emitting elements LD only in parallel.

Each of the light emitting elements LD may include the first end EP1 (for example, a p-type end) connected to the first power VDD via at least one electrode(s) (for example, the first connection electrode ELT1), the pixel circuit PXC, the first power line PL1, and/or the like, and the second end EP2 (for example, an n-type end) connected to the second power VSS via at least another electrode(s) (for example, the fifth connection electrode ELT5), the second power line PL2, and the like. That is, the light emitting elements LD may be connected in the forward direction between the first power VDD and the second power VSS. The light emitting elements LD connected in the forward direction may configure effective light sources of the light emitting unit EMU.

When the driving current is supplied through the corresponding pixel circuit PXC, the light emitting elements LD may emit light with a luminance corresponding to the driving current. For example, during each frame period, the pixel circuit PXC may supply the driving current corresponding to a grayscale value to be expressed in the corresponding frame to the light emitting unit EMU. Accordingly, while the light emitting elements LD emit light with the luminance corresponding to the driving current, the light emitting unit EMU may express the luminance corresponding to the driving current.

Figure 5:
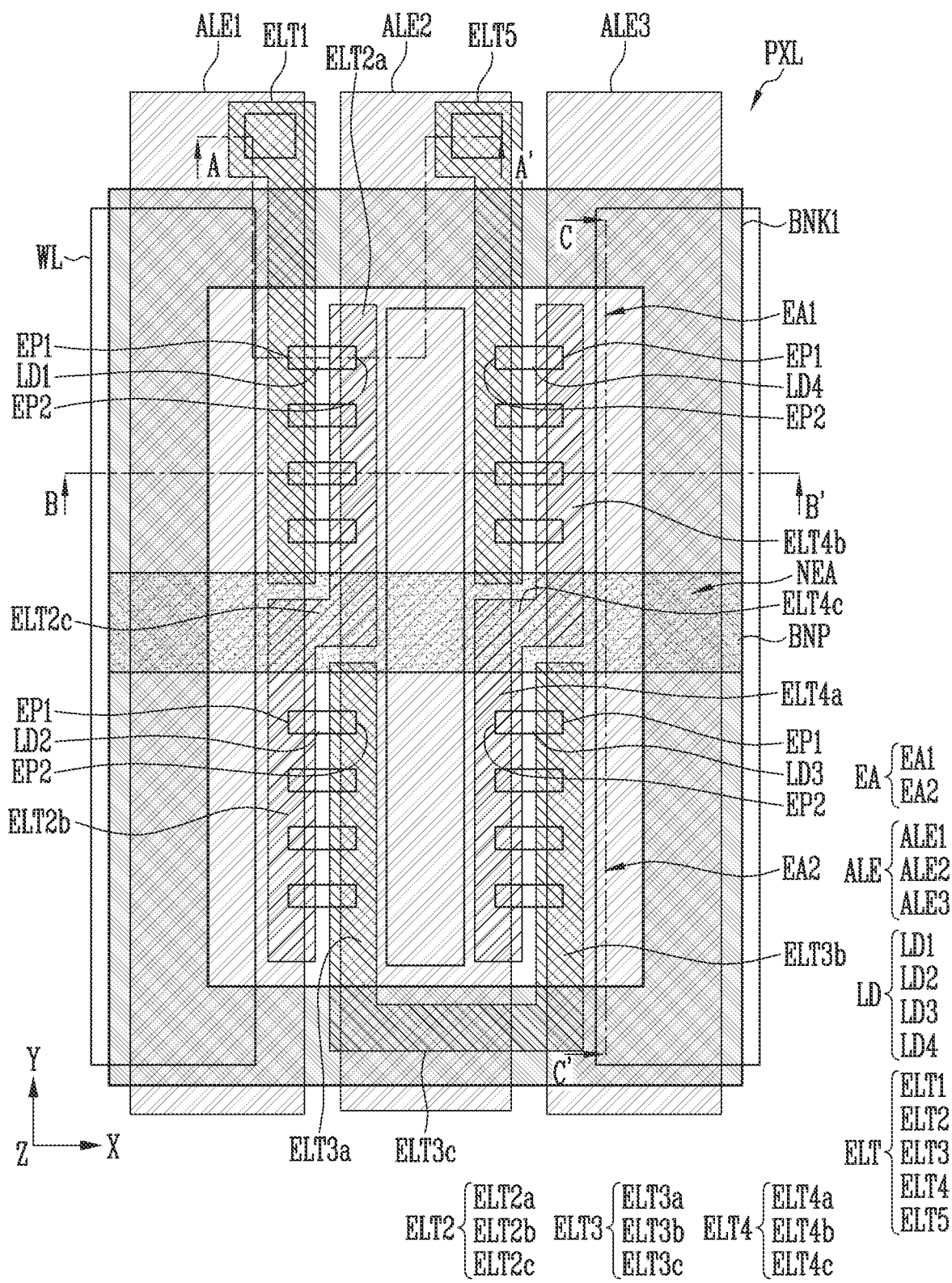
FIGS. 5 to 7 are plan views illustrating a pixel according to one or more embodiments.
Figure 6:
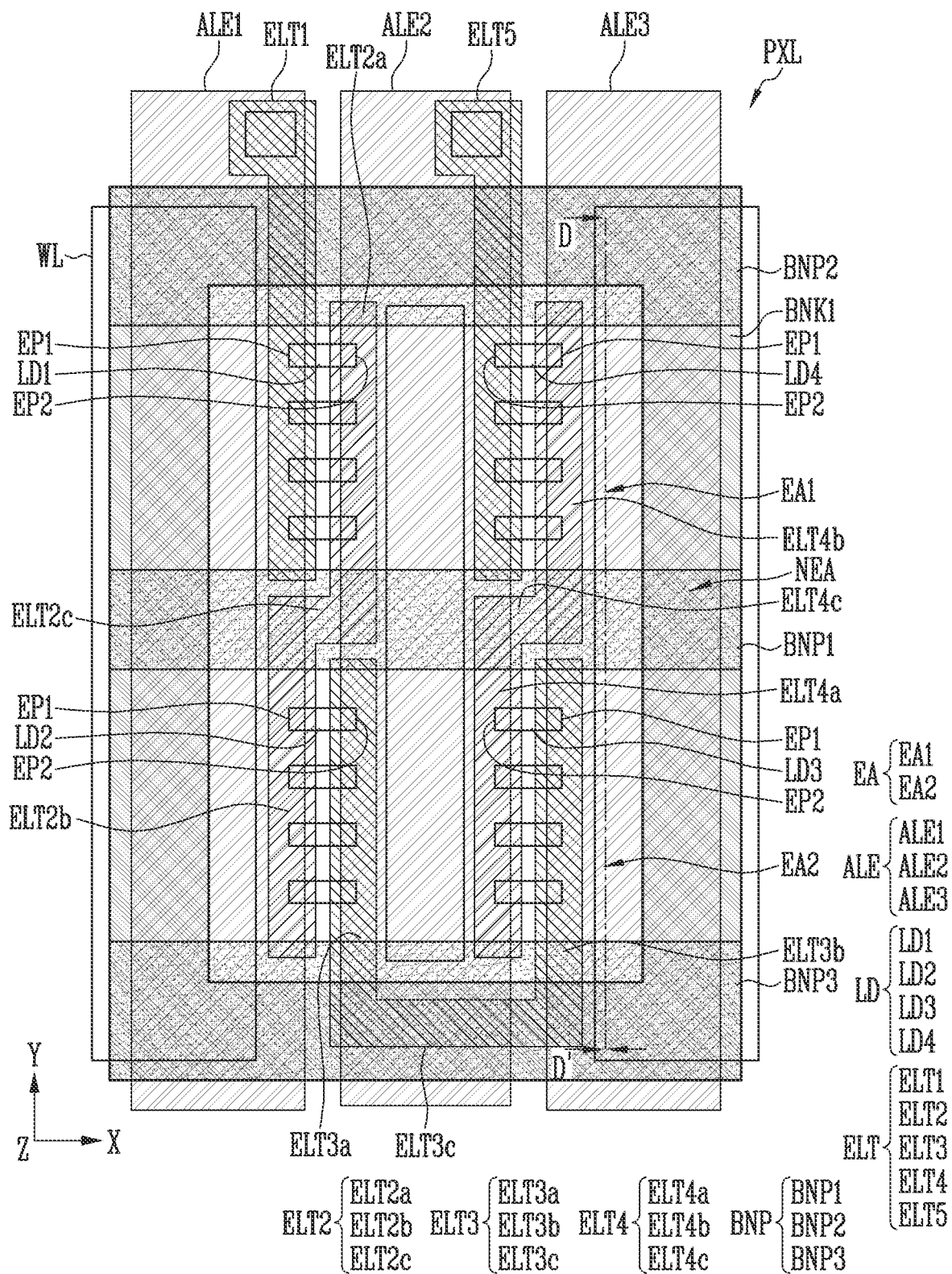
Figure 7:
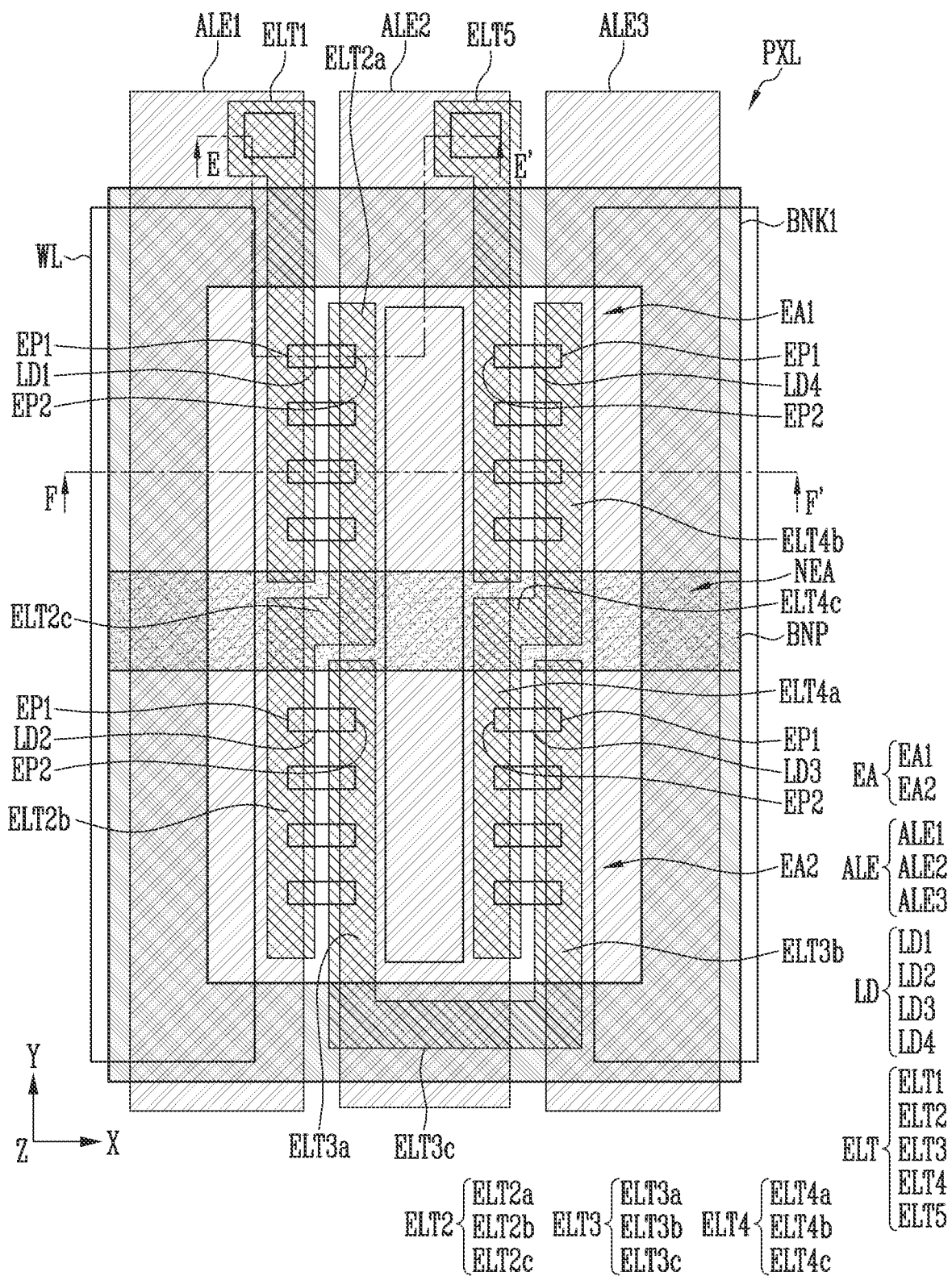
Figure 8:
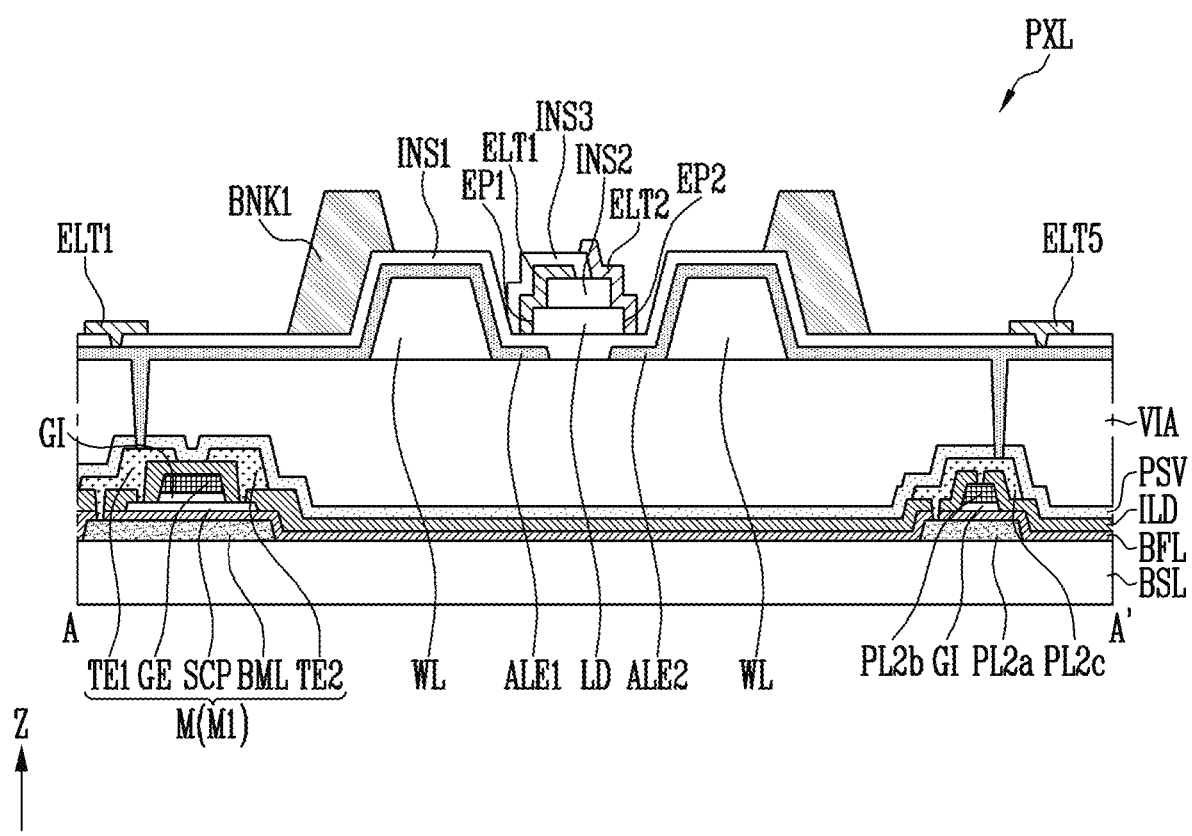
FIG. 8 is a cross-sectional view taken along the line A-A' of FIG. 5.
Figure 9:
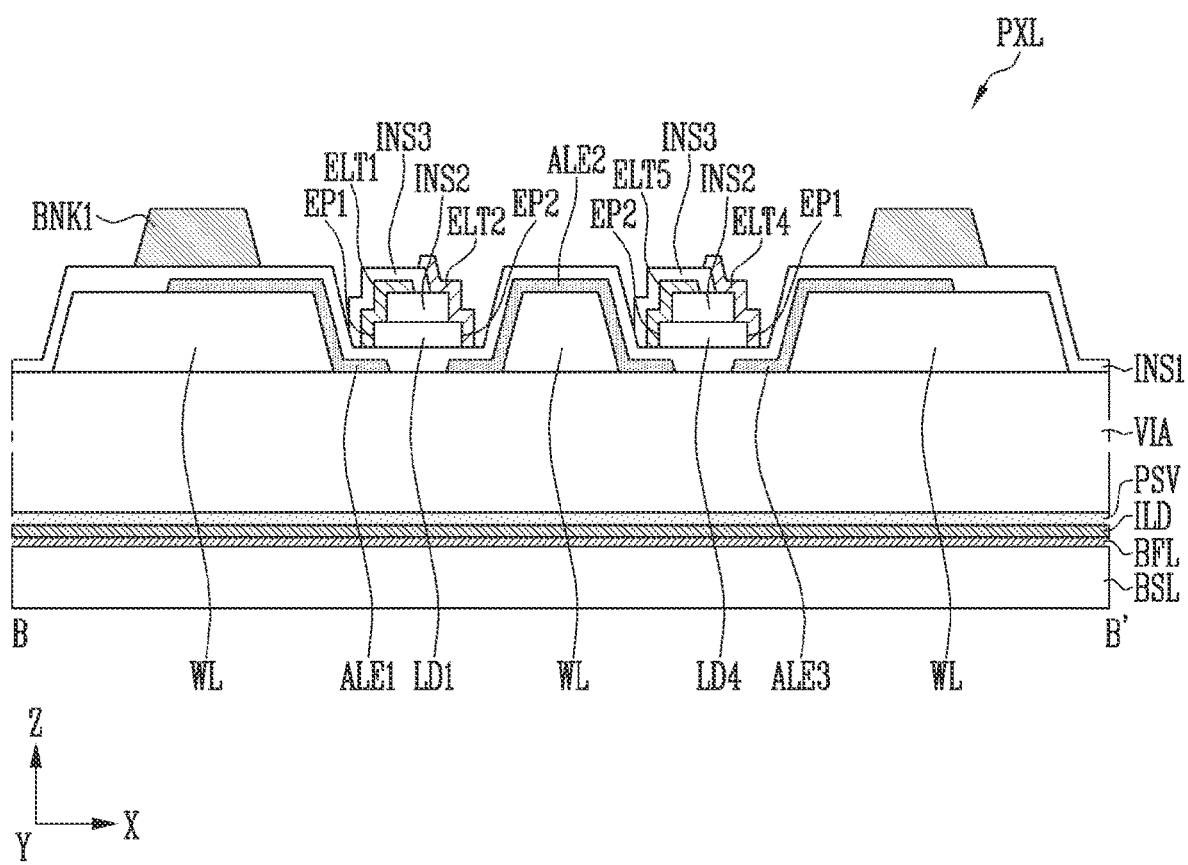
FIG. 9 is a cross-sectional view taken along the line B-B' of FIG. 5.
Figure 10:
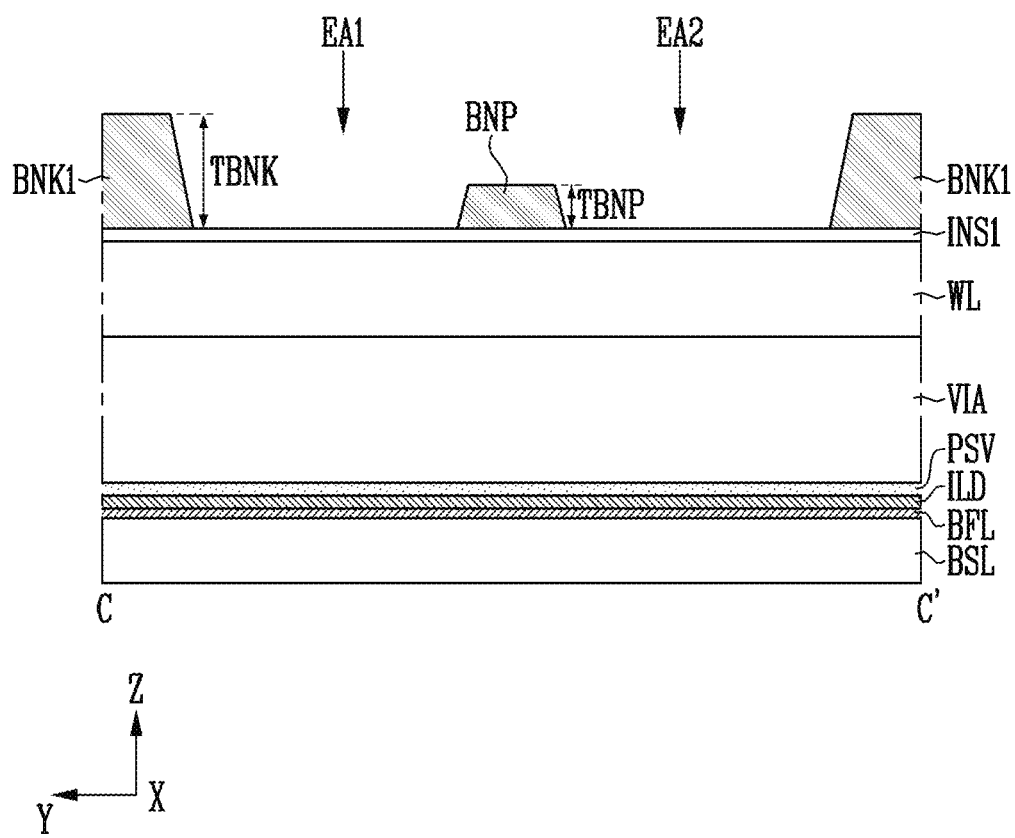
FIG. 10 is a cross-sectional view taken along the line C-C' of FIG. 5.
Figure 11:
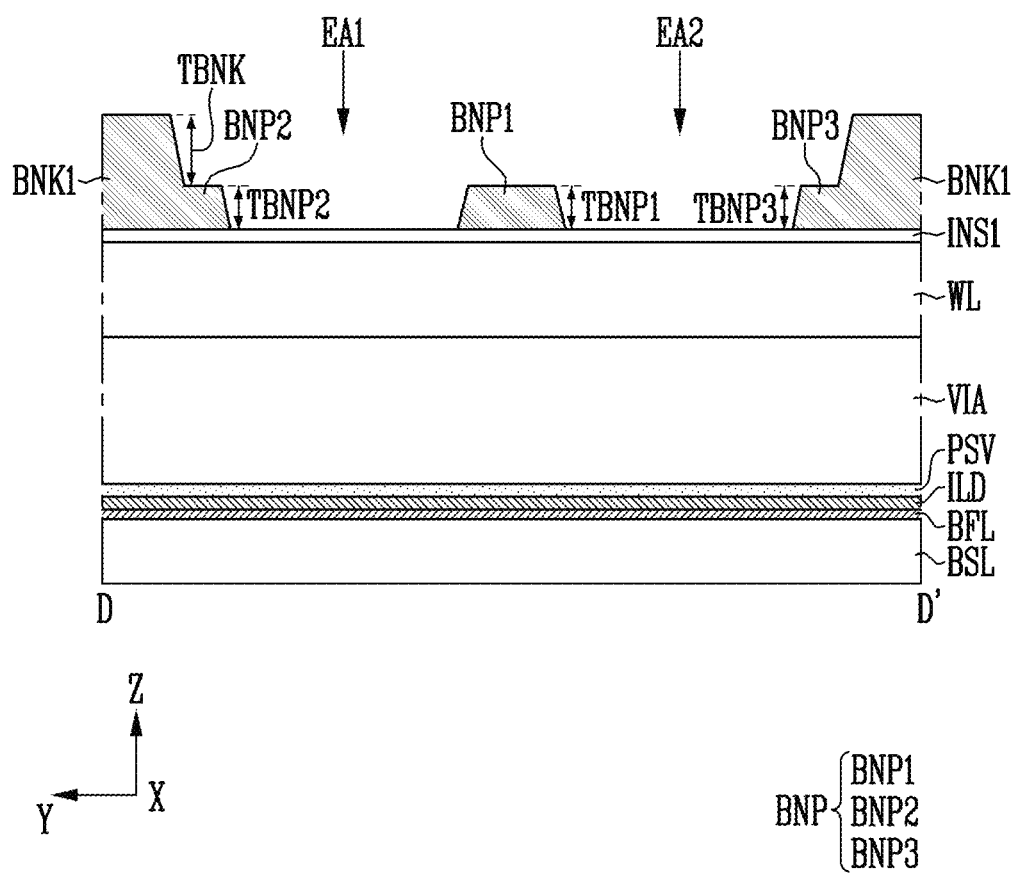
FIGS. 11 and 12 are cross-sectional views taken along the line D-D' of FIG. 6.
Figure 12:
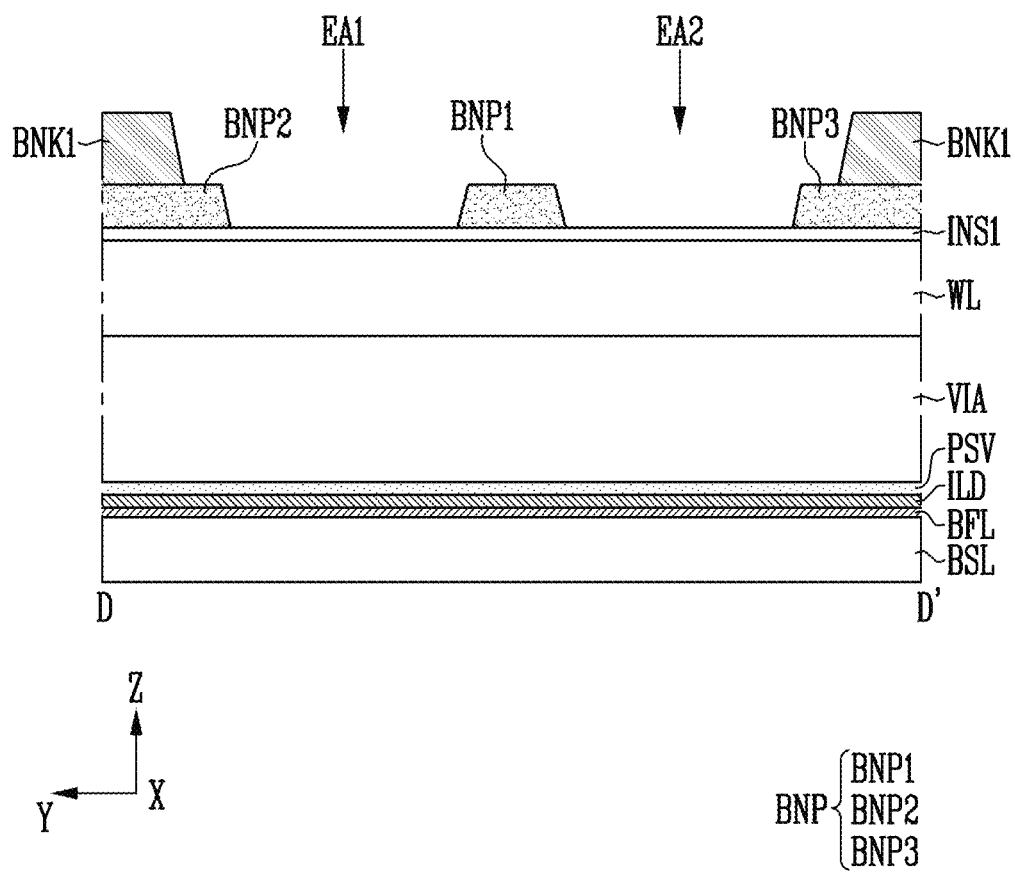
Figure 13:
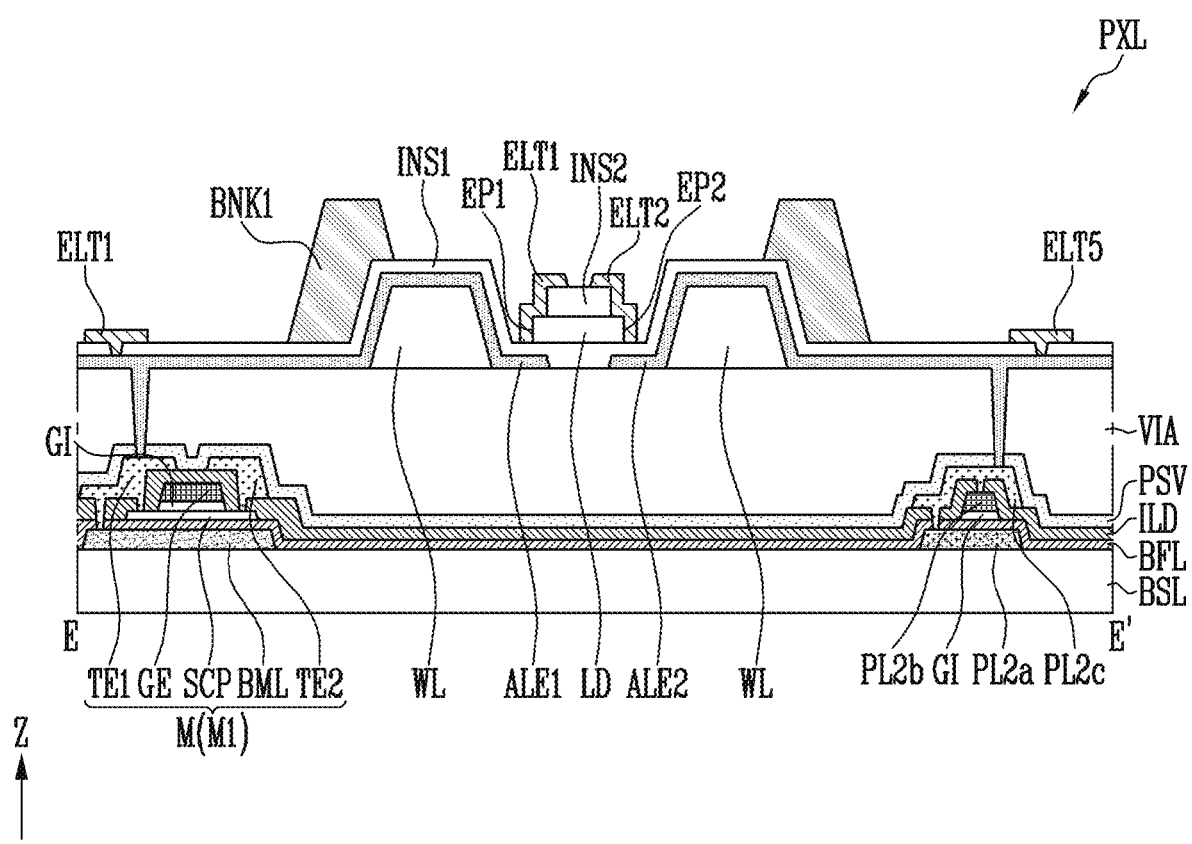
FIG. 13 is a cross-sectional view taken along the line E-E' of FIG. 7.
Figure 14:
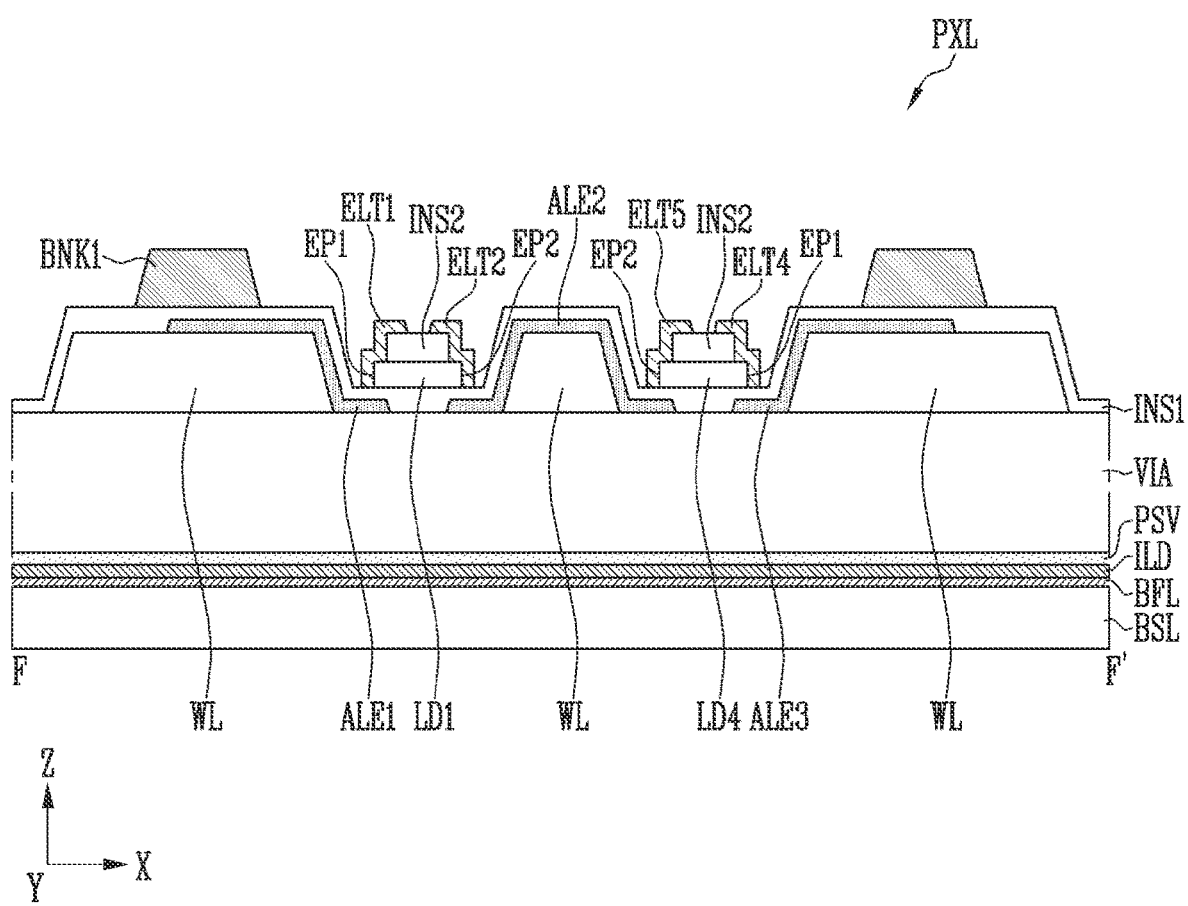
FIG. 14 is a cross-sectional view taken along the line F-F' of FIG. 7.

FIGS. 5 to 7 are plan views illustrating a pixel according to one or more embodiments. FIG. 8 is a cross-sectional view taken along the line A-A' of FIG. 5. FIG. 9 is a cross-sectional view taken along the line B-B' of FIG. 5. FIG. 10 is a cross-sectional view taken along the line C-C' of FIG. 5. FIGS. 11 and 12 are cross-sectional views taken along the line D-D' of FIG. 6. FIG. 13 is a cross-sectional view taken along the line E-E' of FIG. 7. FIG. 14 is a cross-sectional view taken along the line F-F' of FIG. 7.

As an example, FIGS. 5 to 7 may be any one of the first to third pixels PXL1, PXL2, and PXL3 configuring the pixel unit PXU of FIG. 3, and the first to third pixels PXL1, PXL2, and PXL3 may have structures substantially identical or similar to each other. In addition, FIGS. 5 to 7 disclose one or more embodiments in which each pixel PXL includes light emitting elements LD located in four series stages as shown in FIG. 4, but the number of series stages of each pixel PXL may be variously changed according to one or more embodiments.

Hereinafter, when one or more of the first to fourth light emitting elements LD1, LD2, LD3, and LD4 are arbitrarily referenced, or when two or more types of light emitting elements are collectively referenced, the one or more of the first to fourth light emitting elements LD1, LD2, LD3, and LD4 or two or more types of light emitting elements are referred to as a "light emitting element LD" or "light emitting elements LD." In addition, when at least one of electrodes including first to third electrodes ALE1, ALE2, and ALE3 is arbitrarily referenced, the at least one of electrodes is referred to as an "electrode ALE" or "electrodes ALE," and when at least one of electrodes including the first to fifth connection electrodes ELT1, ELT2, ELT3, ELT4, and ELT5 is arbitrarily referenced, the at least one of connection electrodes is referred to as a "connection electrode ELT" or "connection electrodes ELT."

Referring to FIGS. 5 to 7, each pixel PXL may include an emission area EA and a non-emission area NEA. The emission area EA may be an area capable of emitting light including the light emitting elements LD. The emission area EA may include a first emission area EA1 and a second emission area EA2. The non-emission area NEA may be located between the first emission area EA1 and the second emission area EA2. The non-emission area NEA may be located to surround the first emission area EA1 and the second emission area EA2. A first bank BNK1 and/or a bank pattern BNP may be located in the non-emission area NEA.

The first bank BNK1 may be located between or at a boundary between the first to third pixels PXL1, PXL2, and PXL3 described above. The first bank BNK1 may serve to partition the emission area EA in which the light emitting elements LD may be provided in a step of supplying the light emitting elements LD to each of the pixels PXL. That is, a desired type and/or amount of light emitting element ink may be supplied to the emission area EA partitioned by the first bank BNK1. The first bank BNK1 may surround the first emission area EA1 and the second emission area EA2. As shown in FIG. 5, the bank pattern BNP may be located between the first emission area EA1 and the second emission area EA2. Alternatively, as shown in FIG. 6, the bank pattern BNP may include first to third bank patterns BNP1, BNP2, and BNP3 spaced apart from each other. The first bank pattern BNP1 may be located between the first emission area EA1 and the second emission area EA2. The second bank pattern BNP2 may be located between the first bank BNK1 and the first emission area EA1. The third bank pattern BNP3 may be located between the first bank BNK1 and the second emission area EA2. As described above, by forming the bank pattern BNP in the non-emission area NEA, a phenomenon in which the light emitting elements LD are provided in the non-emission area NEA and are aggregated may be reduced or prevented. Therefore, because disconnection or a short circuit defect due to aggregation of the light emitting elements LD may be reduced or minimized, a dark spot defect of the pixel PXL may be improved.

Each pixel PXL may include partition walls WL, the electrodes ALE, the light emitting elements LD, and/or the connection electrodes ELT.

The partition walls WL may overlap the emission area EA and may be spaced apart from each other. The partition walls WL may be at least partially located in the non-emission area NEA. The partition walls WL may extend along a second direction (Y-axis direction), and may be spaced apart from each other along a first direction (X-axis direction).

Each of the partition walls WL may partially overlap at least one electrode ALE in at least the emission area EA. For example, each of the partition walls WL may be provided under the electrodes ALE. As the partition walls WL are provided under one area of each of the electrodes ALE, one area of each of the electrodes ALE may protrude in an upper direction of the pixel PXL, that is, a third direction (Z-axis direction) in an area in which the partition walls WL are formed. When the partition walls WL and/or the electrodes ALE include a reflective material, a reflective wall structure may be formed around the light emitting elements LD. Accordingly, because light emitted from the light emitting elements LD may be emitted to the upper direction of the pixel PXL (for example, in a front surface direction of the display panel PNL including a viewing angle range (e.g., predetermined viewing angle range)), light output efficiency of the display panel PNL may be improved.

The electrodes ALE may be provided in at least the emission area EA. The electrodes ALE may extend along the second direction (Y-axis direction) and may be spaced apart from each other along the first direction (X-axis direction).

Each of the first to third electrodes ALE1, ALE2, and ALE3 may extend along the second direction (Y-axis direction), and may be sequentially located to be spaced apart along the first direction (X-axis direction). Some of the electrodes ALE may be connected to the pixel circuit PXC of FIG. 4 and/or a power line (e.g., predetermined power line) through a contact hole. For example, a first electrode ALE1 may be connected to the pixel circuit PXC and/or the first power line PL1 through the contact hole, and a second electrode ALE2 may be connected to the second power line PL2 through the contact hole.

According to one or more embodiments, some of the electrodes ALE may be electrically connected to some of the connection electrodes ELT through a contact hole. For example, the first electrode ALE1 may be electrically connected to the first connection electrode ELT1 through the contact hole, and the second electrode ALE2 may be electrically connected to the fifth connection electrode ELT5 through the contact hole.

A pair of electrodes ALE adjacent to each other may receive different signals in an alignment step of the light emitting elements LD. For example, when first to third electrodes ALE1, ALE2, and ALE3 are sequentially arranged along the first direction (X-axis direction), the first electrode ALE1 and the second electrode ALE2 may receive different alignment signals, and the second electrode ALE2 and the third electrode ALE3 may receive different alignment signals.

Each of the light emitting elements LD may be aligned between a pair of electrodes ALE in the emission area EA. In addition, each of the light emitting elements LD may be electrically connected between a pair of connection electrodes ELT.

The first light emitting element LD1 may be aligned between the first and second electrodes ALE1 and ALE2. The first light emitting element LD1 may be electrically connected between the first and second connection electrodes ELT1 and ELT2. For example, the first light emitting element LD1 may be aligned in a first area (for example, an upper area) of the first and second electrodes ALE1 and ALE2 in the first emission area EA1, the first end EP1 of the first light emitting element LD1 may be electrically connected to the first connection electrode ELT1, and the second end EP2 of the first light emitting element LD1 may be electrically connected to the second connection electrode ELT2.

The second light emitting element LD2 may be aligned between the first and second electrodes ALE1 and ALE2. The second light emitting element LD2 may be electrically connected between the second and third connection electrodes ELT2 and ELT3. For example, the second light emitting element LD2 may be aligned in a second area (for example, a lower area) of the first and second electrodes ALE1 and ALE2 in the second emission area EA2, the first end EP1 of the second light emitting element LD2 may be electrically connected to the second connection electrode ELT2, and the second end EP2 of the second light emitting element LD2 may be electrically connected to the third connection electrode ELT3.

The third light emitting element LD3 may be aligned between the second and third electrodes ALE2 and ALE3. The third light emitting element LD3 may be electrically connected between the third and fourth connection electrodes ELT3 and ELT4. For example, the third light emitting element LD3 may be aligned in a second area (for example, a lower area) of the second and third electrodes ALE2 and ALE3 in the second emission area EA2, the first end EP1 of the third light emitting element LD3 may be electrically connected to the third connection electrode ELT3, and the second end EP2 of the third light emitting element LD3 may be electrically connected to the fourth connection electrode ELT4.

The fourth light emitting element LD4 may be aligned between the second and third electrodes ALE2 and ALE3. The fourth light emitting element LD4 may be electrically connected between the fourth and fifth connection electrodes ELT4 and ELT5. For example, the fourth light emitting element LD4 may be aligned in a first area (for example, an upper area) of the second and third electrodes ALE2 and ALE3 in the first emission area EA1, and the first end EP1 of the fourth light emitting element LD4 may be electrically connected to the fourth connection electrode ELT4, and the second end EP2 of the fourth light emitting element LD4 may be electrically connected to the fifth connection electrode ELT5.

For example, the first light emitting element LD1 may be positioned in an upper left area of the emission area EA, and the second light emitting element LD2 may be positioned in a lower left area of the emission area EA. The third light emitting element LD3 may be positioned in a lower right area of the emission area EA, and the fourth light emitting element LD4 may be positioned in an upper right area of the emission area EA. However, an arrangement, a connection structure, and/or the like of the light emitting elements LD may be variously changed according to a structure of the light emitting unit EMU, the number of series stages, and the like.

Each of the connection electrodes ELT may be provided in at least the emission area EA and may be located to overlap the at least one electrode ALE and/or the light emitting element LD. For example, each of the connection electrodes ELT may be formed on the electrodes ALE and/or the light emitting elements LD to overlap the electrodes ALE and/or the light emitting elements LD, and may be electrically connected to the light emitting elements LD.

The first connection electrode ELT1 may be located in a first area (for example, an upper area) of the first electrode ALE1 and on the first ends EP1 of the first light emitting elements LD1 in the first emission area EA1, and may be electrically connected to the first ends EP1 of the first light emitting elements LD1. An end of the first connection electrode ELT1 may overlap the bank pattern BNP or the first bank pattern BNP1 described above, but is not limited thereto.

A first electrode portion ELT2a of the second connection electrode ELT2 may be located in a first area (for example, an upper area) of the second electrode ALE2 and on the second ends EP2 of the first light emitting elements LD1 in the first emission area EA1, and may be electrically connected to the second ends EP2 of the first light emitting elements LD1. An end of the first electrode portion ELT2a of the second connection electrode ELT2 may overlap the second bank pattern BNP2 described above, but is not limited thereto.

A second electrode portion ELT2b of the second connection electrode ELT2 may be located in a second area (for example, a lower area) of the first electrode ALE1 and on the first ends EP1 of the second light emitting elements LD2 in the second emission area EA2, and may be electrically connected to the first ends EP1 of the second light emitting elements LD2. An end of the second electrode portion ELT2b of the second connection electrode ELT2 may overlap the third bank pattern BNP3 described above, but is not limited thereto.

A connection portion ELT2c may be located between the first electrode portion ELT2a and the second electrode portion ELT2b of the second connection electrode ELT2. The connection portion ELT2c of the second connection electrode ELT2 may be located in the non-emission area NEA. For example, the connection portion ELT2c of the second connection electrode ELT2 may overlap the bank pattern BNP or the first bank pattern BNP1 described above.

The first electrode portion ELT2a and the second electrode portion ELT2b of the second connection electrode ELT2 may be electrically connected to each other by the connection portion ELT2c. Accordingly, the second connection electrode ELT2 may electrically connect the second ends EP2 of the first light emitting elements LD1 and the first ends EP1 of the second light emitting elements LD2.

The first electrode portion ELT2a, the second electrode portion ELT2b, and the connection portion ELT2c of the second connection electrode ELT2 may be integrally provided. That is, the first electrode portion ELT2a, the second electrode portion ELT2b, and the connection portion ELT2c of the second connection electrode ELT2 may be concurrently or substantially simultaneously formed in the same process. That is, the first electrode portion ELT2a, the second electrode portion ELT2b, and the connection portion ELT2c of the second connection electrode ELT2 may be located in the same layer. The first electrode portion ELT2a, the second electrode portion ELT2b, and the connection portion ELT2c of the second connection electrode ELT2 may include the same material.

A first electrode portion ELT3a of the third connection electrode ELT3 may be located in a second area (for example, a lower area) of the second electrode ALE2 and on the second ends EP2 of the second light emitting elements LD in the second emission area EA2, and may be electrically connected to the second ends EP2 of the second light emitting elements LD2. An end of the first electrode portion ELT3a of the third connection electrode ELT3 may overlap the bank pattern BNP or the first bank pattern BNP1 described above, but is not limited thereto.

A second electrode portion ELT3b of the third connection electrode ELT3 may be located in a second area (for example, a lower area) of the third electrode ALE3 and on the first ends EP1 of the third light emitting elements LD3 in the second emission area EA2, and may be electrically connected to the first ends EP1 of the third light emitting elements LD3. An end of the second electrode portion ELT3b of the third connection electrode ELT3 may overlap the bank pattern BNP or the first bank pattern BNP1 described above, but is not limited thereto.

A connection portion ELT3c may be located between the first electrode portion ELT3a and the second electrode portion ELT3b of the third connection electrode ELT3. The connection portion ELT3c of the third connection electrode ELT3 may be located in the non-emission area NEA. For example, the connection portion ELT3c of the third connection electrode ELT3 may overlap the third bank pattern BNP3 described above.

The first electrode portion ELT3a and the second electrode portion ELT3b of the third connection electrode ELT3 may be electrically connected to each other by the connection portion ELT3c. Accordingly, the third connection electrode ELT3 may electrically connect the second ends EP2 of the second light emitting elements LD2 and the first ends EP1 of the third light emitting elements LD3.

The first electrode portion ELT3a, the second electrode portion ELT3b, and the connection portion ELT3c of the third connection electrode ELT3 may be integrally provided. That is, the first electrode portion ELT3a, the second electrode portion ELT3b, and the connection portion ELT3c of the third connection electrode ELT3 may be concurrently or substantially simultaneously formed in the same process. That is, the first electrode portion ELT3a, the second electrode portion ELT3b, and the connection portion ELT3c of the third connection electrode ELT3 may be located in the same layer. The first electrode portion ELT3a, the second electrode portion ELT3b, and the connection portion ELT3c of the third connection electrode ELT3 may include the same material.

A first electrode portion ELT4a of the fourth connection electrode ELT4 may be located in a second area (for example, a lower area) of the second electrode ALE2 and on the second ends EP2 of the third light emitting elements LD3 in the second emission area EA2, and may be electrically connected to the second ends EP2 of the third light emitting elements LD3. An end of the first electrode portion ELT4a of the fourth connection electrode ELT4 may overlap the third bank pattern BNP3 described above, but is not limited thereto.

A second electrode portion ELT4b of the fourth connection electrode ELT4 may be located in a first area (for example, an upper area) of the third electrode ALE3 and on the first ends EP1 of the fourth light emitting elements LD4 in the first emission area EA1, and may be electrically connected to the first ends EP1 of the fourth light emitting elements LD4. An end of the second electrode portion ELT4b of the fourth connection electrode ELT4 may overlap the second bank pattern BNP2 described above, but is not limited thereto.

A connection portion ELT4c may be located between the first electrode portion ELT4a and the second electrode portion ELT4b of the fourth connection electrode ELT4. The connection portion ELT4c of the fourth connection electrode ELT4 may be located in the non-emission area NEA. For example, the connection portion ELT4c of the fourth connection electrode ELT4 may overlap the bank pattern BNP or the first bank pattern BNP1 described above.

The first electrode portion ELT4a and the second electrode portion ELT4b of the fourth connection electrode ELT4 may be electrically connected to each other by the connection portion ELT4c. Accordingly, the fourth connection electrode ELT4 may electrically connect the second ends EP2 of the third light emitting elements LD3 and the first ends EP1 of the fourth light emitting elements LD4.

The first electrode portion ELT4a, the second electrode portion ELT4b, and the connection portion ELT4c of the fourth connection electrode ELT4 may be integrally provided. That is, the first electrode portion ELT4a, the second electrode portion ELT4b, and the connection portion ELT4c of the fourth connection electrode ELT4 may be concurrently or substantially simultaneously formed in the same process. That is, the first electrode portion ELT4a, the second electrode portion ELT4b, and the connection portion ELT4c of the fourth connection electrode ELT4 may be located in the same layer. The first electrode portion ELT4a, the second electrode portion ELT4b, and the connection portion ELT4c of the fourth connection electrode ELT4 may include the same material.

The fifth connection electrode ELT5 may be located in a first area (for example, an upper area) of the second electrode ALE2 and on the second ends EP2 of the fourth light emitting elements LD4 in the first emission area EA1, and may be electrically connected to the second ends EP2 of the fourth light emitting elements LD4. An end of the fifth connection electrode ELT5 may overlap the bank pattern BNP or the first bank pattern BNP1 described above, but is not limited thereto.

The first connection electrode ELT1, the third connection electrode ELT3, and/or the fifth connection electrode ELT5 may be formed of the same conductive layer. In addition, the second connection electrode ELT2 and the fourth connection electrode ELT4 may be formed of the same conductive layer. For example, as shown in FIG. 5, the connection electrodes ELT may be formed of a plurality of conductive layers. That is, the first connection electrode ELT1, the third connection electrode ELT3, and/or the fifth connection electrode ELT5 may be formed of a first conductive layer, and the second connection electrode ELT2 and the fourth connection electrode ELT4 may be formed of a second conductive layer different from the first conductive layer. Alternatively, as shown in FIG. 7, the first to fifth connection electrodes ELT1, ELT2, ELT3, ELT4, and ELT5 may be formed of the same conductive layer.

In the method described above, the light emitting elements LD aligned between the electrodes ALE may be connected in a desired shape using the connection electrodes ELT. For example, the first light emitting elements LD1, the second light emitting elements LD2, the third light emitting elements LD3, and the fourth light emitting elements LD4 may be connected in series sequentially using the connection electrodes ELT.

Hereinafter, a cross-sectional structure of the pixel PXL is described in detail with reference to FIGS. 8 to 14. FIGS. 8 and 13 show the first transistor M1 among various circuit elements configuring the pixel circuit PXC of FIG. 4, when the first to third transistors M1, M2, and M3 are not required to be separately specified, the first to third transistors M1, M2, and M3 are referred to as "transistor M." Meanwhile, a structure, a position of each layer, and/or the like of the transistors M are/is not limited to the embodiments corresponding to FIGS. 8 and 13, and may be variously changed according to one or more embodiments.

The pixels PXL according to one or more embodiments may include circuit element including the transistors M located on a base layer BSL, and various lines connected to the circuit elements. The electrodes ALE, the light emitting elements LD, the connection electrodes ELT, and/or the first bank BNK1 configuring the light emitting unit EMU may be located on the circuit elements.

For example, the base layer BSL may configure a base member, and may be a rigid or flexible substrate or film. For example, the base layer BSL may be a rigid substrate formed of glass or tempered glass, a flexible substrate (or a thin film) formed of a plastic or metal material, or an insulating layer of at least one layer. A material and/or a physical property of the base layer BSL are/is not particularly limited. In one or more embodiments, the base layer BSL may be substantially transparent. Here, "substantially transparent" may mean that light may be transmitted at a transmittance (e.g., predetermined transmittance) or more. In one or more other embodiments, the base layer BSL may be translucent or opaque. In addition, the base layer BSL may include a reflective material according to one or more embodiments.

The lower conductive layer BML and a first power conductive layer PL2a may be located on the base layer BSL. The lower conductive layer BML and the first power conductive layer PL2a may be located in the same layer. For example, the lower conductive layer BML and the first power conductive layer PL2a may be concurrently or substantially simultaneously formed in the same process, but are not limited thereto. The first power conductive layer PL2a may configure the second power line PL2 described with reference to FIG. 4 or the like.

Each of the lower conductive layer BML and the first power conductive layer PL2a may be formed as a single layer or multiple layers formed of molybdenum (Mo), copper (Cu), aluminum (Al), chromium (Cr), gold (Au), titanium (Ti), and nickel (Ni), neodymium (Nd), indium (In), tin (Sn), and an oxide or an alloy thereof.

A buffer layer BFL may be located on the lower conductive layer BML and the first power conductive layer PL2a. The buffer layer BFL may reduce or prevent the likelihood of an impurity being diffused into the circuit element. The buffer layer BFL may be configured of a single layer, but may be configured of multiple layers of at least two or more layers. When the buffer layer BFL is formed of multiple layers, each layer may be formed of the same material or may be formed of different materials.

A semiconductor pattern SCP may be located on the buffer layer BFL. For example, each semiconductor pattern SCP may include a first area that is in contact with a first transistor electrode TE1, a second area that is in contact with a second transistor electrode TE2, and a channel area positioned between the first and second areas. According to one or more embodiments, one of the first and second areas may be a source area and the other may be a drain area.

According to one or more embodiments, the semiconductor pattern SCP may be formed of polysilicon, amorphous silicon, oxide semiconductor, or the like. In addition, the channel area of the semiconductor pattern SCP may be an intrinsic semiconductor as a semiconductor pattern that is not doped with an impurity. Each of the first and second areas of the semiconductor pattern SCP may be a semiconductor doped with an impurity (e.g., predetermined impurity).

A gate insulating layer GI may be located on the buffer layer BFL and the semiconductor pattern SCP. For example, the gate insulating layer GI may be located between the semiconductor pattern SCP and a gate electrode GE. In addition, the gate insulating layer GI may be located between the buffer layer BFL and a second power conductive layer PL2b. The gate insulating layer GI may be configured of a single layer or multiple layers, and may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

The gate electrode GE of the transistor M and the second power conductive layer PL2b may be located on the gate insulating layer GI. The gate electrode GE and the second power conductive layer PL2b may be located in the same layer. For example, the gate electrode GE and the second power conductive layer PL2b may be concurrently or substantially simultaneously formed in the same process, but are not limited thereto. The gate electrode GE may be located to overlap the semiconductor pattern SCP in the third direction (Z-axis direction) on the gate insulating layer GI. The second power conductive layer PL2b may be located to overlap the first power conductive layer PL2a in the third direction (Z-axis direction) on the gate insulating layer GI. The second power conductive layer PL2b may configure the second power line PL2 described with reference to FIG. 4 or the like together with the first power conductive layer PL2a.

Each of the gate electrode GE and the second power conductive layer PL2b may be formed of a single layer or multiple layers formed of molybdenum (Mo), copper (Cu), aluminum (Al), chromium (Cr), gold (Au), titanium (Ti), nickel (Ni), neodymium (Nd), indium (In), tin (Sn), and an oxide or an alloy thereof. For example, each of the gate electrode GE and the second power conductive layer PL2b may be formed of multiple layers in which titanium (Ti), copper (Cu), and/or indium tin oxide (ITO) are/is sequentially or repeatedly stacked.

An interlayer insulating layer ILD may be located on the gate electrode GE and the second power conductive layer PL2b. For example, the interlayer insulating layer ILD may be located between the gate electrode GE and the first and second transistor electrodes TE1 and TE2. In addition, the interlayer insulating layer ILD may be located between the second power conductive layer PL2b and a third power conductive layer PL2c.

The interlayer insulating layer ILD may be configured of a single layer or multiple layers, and may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

The first and second transistor electrodes TE1 and TE2 of the transistor M and the third power conductive layer PL2c may be located on the interlayer insulating layer ILD. The first and second transistor electrodes TE1 and TE2 and the third power conductive layer PL2c may be located in the same layer. For example, the first and second transistor electrodes TE1 and TE2 and the third power conductive layer PL2c may be concurrently or substantially simultaneously formed in the same process, but are not limited thereto.

The first and second transistor electrodes TE1 and TE2 may be located to overlap the semiconductor pattern SCP in the third direction (Z-axis direction). The first and second transistor electrodes TE1 and TE2 may be electrically connected to the semiconductor pattern SCP. For example, the first transistor electrode TE1 may be electrically connected to the first area of the semiconductor pattern SCP through a contact hole passing through the interlayer insulating layer ILD. In addition, the first transistor electrode TE1 may be electrically connected to the lower conductive layer BML through a contact hole passing through the interlayer insulating layer ILD and the buffer layer BFL. The second transistor electrode TE2 may be electrically connected to the second area of the semiconductor pattern SCP through a contact hole passing through the interlayer insulating layer ILD. According to one or more embodiments, any one of the first and second transistor electrodes TE1 and TE2 may be a source electrode, and the other may be a drain electrode.

The third power conductive layer PL2c may be located to overlap the first power conductive layer PL2a and/or the second power conductive layer PL2b in the third direction (Z-axis direction). The third power conductive layer PL2c may be electrically connected to the first power conductive layer PL2a and/or the second power conductive layer PL2b. For example, the third power conductive layer PL2c may be electrically connected to the first power conductive layer PL2a through a contact hole passing through the interlayer insulating layer ILD and the buffer layer BFL. In addition, the third power conductive layer PL2c may be electrically connected to the second power conductive layer PL2b through a contact hole passing through the interlayer insulating layer ILD. The third power conductive layer PL2c may configure the second power line PL2 described with reference to FIG. 4 or the like together with the first power conductive layer PL2a and/or the second power conductive layer PL2b.

The first and second transistor electrodes TE1 and TE2 and the third power conductive layer PL2c may be formed of a single layer or multiple layers formed of molybdenum (Mo), copper (Cu), aluminum (Al), chromium (Cr), gold (Au), titanium (Ti), nickel (Ni), neodymium (Nd), indium (In), tin (Sn), and an oxide or an alloy thereof.

A protective layer PSV may be located on the first and second transistor electrodes TE1 and TE2 and the third power conductive layer PL2c. The protective layer PSV may be configured of a single layer or multiple layers, and may include various types of inorganic materials including silicon oxide (SiOx), silicon nitride (SiNx), silicon oxynitride (SiOxNy), aluminum nitride (AlNx), aluminum oxide (AlOx), zirconium (ZrOx), hafnium oxide (HfOx), or titanium oxide (TiOx).

A via layer VIA may be located on the protective layer PSV. The via layer VIA may be formed of an organic material to planarize a lower step difference. For example, the via layer VIA may include an organic material such as an acrylates resin, an epoxy resin, a phenolic resin, a polyam ides resin, a polyim ides resin, a polyesters resin, a polyphenylenesulfides resin, or benzocyclobutene (BCB). However, the disclosure is not limited thereto, and the via layer VIA may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

The partition walls WL may be located on the via layer VIA. The partition walls WL may serve to form a step difference (e.g., predetermined step difference) so that the light emitting elements LD may be easily aligned in the emission area EA.

The partition walls WL may have various shapes according to one or more embodiments. In one or more embodiments, the partition walls WL may have a shape protruding in the third direction (Z-axis direction) on the base layer BSL. In addition, the partition walls WL may be formed to have an inclined surface inclined at an angle (e.g., predetermined angle) with respect to the base layer BSL. However, the disclosure is not limited thereto, and the partition walls WL may have a side wall of a curved surface, a step shape, or the like. For example, the partition walls WL may have a cross-section of a semi-circle shape, a semi-ellipse shape, or the like.

The partition walls WL may include at least one organic material and/or inorganic material. For example, the partition walls WL may include an organic material such as an acrylates resin, an epoxy resin, a phenolic resin, a polyamides resin, a polyimides resin, a polyesters resin, a polyphenylenesulfides resin, or benzocyclobutene (BCB). However, the disclosure is not limited thereto, and the partition walls WL may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

The electrodes ALE may be located on the via layer VIA and the partition walls WL. The electrodes ALE may at least partially cover a side surface and/or an upper surface of the partition walls WL. The electrodes ALE located on the partition walls WL may have a shape corresponding to the partition wall WL. For example, the electrodes ALE located on the partition walls WL may include an inclined surface or a curved surface having a shape corresponding to the shape of the partition walls WL. In this case, because the partition walls WL and the electrodes ALE may reflect the light emitted from the light emitting elements LD and guide the light in the front direction of the pixel PXL, that is, in the third direction (Z-axis direction) as a reflective member, the light output efficiency of the display panel PNL may be improved.

The electrodes ALE may be located to be spaced apart from each other. The electrodes ALE may be located in the same layer. For example, the electrodes ALE may be concurrently or substantially simultaneously formed in the same process, but the disclosure is not limited thereto.

The electrodes ALE may receive an alignment signal in an alignment step of the light emitting elements LD. Accordingly, an electric field may be formed between the electrodes ALE, and thus the light emitting elements LD provided to each of the pixels PXL may be aligned between the electrodes ALE.

The electrodes ALE may include at least one conductive material. For example, the electrodes ALE may include at least one metal among various metal materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), and copper (Cu), or an alloy including the at least one metal, a conductive oxide such as indium tin oxide (ITO), indium zinc oxide (IZO), indium tin zinc oxide (ITZO), aluminum zinc oxide (AZO), gallium zinc oxide (GZO), zinc tin oxide (ZTO), or gallium tin oxide (GTO), and at least one conductive material among conductive polymers such as PEDOT, but are not limited thereto.

The first electrode ALE1 may be electrically connected to the first transistor electrode TE1 of the transistor M through a contact hole passing through the via layer VIA and the protective layer PSV. The second electrode ALE2 may be electrically connected to the third power conductive layer PL2c through a contact hole passing through the via layer VIA and the protective layer PSV.

A first insulating layer INS1 may be located on the electrodes ALE. The first insulating layer INS1 may be configured of a single layer or multiple layers, and may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

Referring to FIG. 10, the first bank BNK1 and the bank pattern BNP may be located on the first insulating layer INS1. The first bank BNK1 and the bank pattern BNP may be located in the same layer. The first bank BNK1 and the bank pattern BNP may include the same material. For example, the first bank BNK1 and the bank pattern BNP may be integrally provided. That is, the first bank BNK1 and the bank pattern BNP may be concurrently or substantially simultaneously formed in the same process, but are not limited thereto. A thickness TBNK of the third direction (Z-axis direction) of the first bank BNK1 may be thicker than a thickness TBNP of the third direction (Z-axis direction) of the bank pattern BNP, but is not limited thereto.

As shown in FIG. 11, when the bank pattern BNP includes first to third bank patterns BNP1, BNP2, and BNP3, the first to third bank patterns BNP1, BNP2, and BNP3 may be located in the same layer. The first to third bank patterns BNP1, BNP2, and BNP3 may include the same material. For example, the first to third bank patterns BNP1, BNP2, and BNP3 may be concurrently or substantially simultaneously formed in the same process, but are not limited thereto. In addition, the first to third bank patterns BNP1, BNP2, and BNP3 may be provided integrally with the first bank BNK1. That is, the first bank BNK1 and the first to third bank patterns BNP1, BNP2, and BNP3 may be concurrently or substantially simultaneously formed in the same process, but are not limited thereto. For example, as shown in FIG. 12, the first to third bank patterns BNP1, BNP2, and BNP3 may be formed separately from the first bank BNK1 and located on a layer different from that of the first bank BNK1. FIG. 12 illustrates a case in which the first bank BNK1 is formed on the first to third bank patterns BNP1, BNP2, and BNP3, but the disclosure is not limited thereto, and the first to third bank patterns BNP1, BNP2, and BNP3 may be formed on the first bank BNK1.

The thickness TBNK of the third direction (Z-axis direction) of the first bank BNK1 may be thicker than a thickness TBNP1 of the third direction (Z-axis direction) of the first bank pattern BNP1, a thickness TBNP2 of the third direction (Z-axis direction) of the second bank pattern BNP2, and/or a thickness TBNP3 of the third direction (Z-axis direction) of the third bank pattern BNP3, but is not limited thereto. In addition, the thickness TBNP1 of the third direction (Z-axis direction) of the first bank pattern BNP1, the thickness TBNP2 of the third direction (Z-axis direction) of the second bank pattern BNP2, and the thickness TBNP3 of the third direction (Z-axis direction) of the third bank pattern BNP3 may be the same, but are not limited thereto.

The first bank BNK1 may include an organic material such as an acrylates resin, an epoxy resin, a phenolic resin, a polyamides resin, a polyimides resin, a polyesters resin, a polyphenylenesulfides resin, or benzocyclobutene (BCB). However, the disclosure is not limited thereto, and the first bank BNK1 may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

The bank pattern BNP may include an organic material such as an acrylates resin, an epoxy resin, a phenolic resin, a polyam ides resin, a polyim ides resin, a polyesters resin, a polyphenylenesulfides resin, or benzocyclobutene (BCB). However, the disclosure is not limited thereto, and the bank pattern BNP may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

The light emitting elements LD may be located between the electrodes ALE. The light emitting elements LD may be located between the partition walls WL.

The light emitting elements LD may be prepared in a dispersed form in the light emitting element ink, and may be supplied to each of the pixels PXL through an inkjet printing method or the like. For example, the light emitting elements LD may be dispersed in a volatile solvent and provided to each of the pixels PXL. Subsequently, when the alignment signal is supplied to the electrodes ALE, an electric field may be formed between the electrodes ALE, and thus the light emitting elements LD may be aligned between the electrodes ALE. After the light emitting elements LD are aligned, the light emitting elements LD may be stably arranged between the electrodes ALE by evaporating the solvent or removing the solvent in another method.

A second insulating layer INS2 may be located on the light emitting elements LD. For example, the second insulating layer INS2 may be partially provided on the light emitting elements LD and may expose the first and second ends EP1 and EP2 of the light emitting elements LD. When the second insulating layer INS2 is formed on the light emitting elements LD after alignment of the light emitting elements LD is completed, the light emitting elements LD may be reduced or prevented from being separated from an aligned position.

The second insulating layer INS2 may be configured of a single layer or multiple layers, and may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

The connection electrodes ELT may be respectively located on the first and second ends EP1 and EP2 of the light emitting elements LD exposed by the second insulating layer INS2. The first connection electrode ELT1 may be directly located on the first end EP1 of the first light emitting elements LD1 to contact the first end EP1 of the first light emitting elements LD1.

In addition, the second connection electrode ELT2 may be directly located on the second end EP2 of the first light emitting elements LD1 to contact the second end EP2 of the first light emitting elements LD1. In addition, the second connection electrode ELT2 may be directly located on the first end EP1 of the second light emitting elements LD2 to contact the first end EP1 of the second light emitting elements LD2. That is, the second connection electrode ELT2 may electrically connect the second end EP2 of the first light emitting elements LD1 and the first end EP1 of the second light emitting elements LD2.

Similarly, the third connection electrode ELT3 may be directly located on the second end EP2 of the second light emitting elements LD2 to contact the second end EP2 of the second light emitting elements LD2. In addition, the third connection electrode ELT3 may be directly located on the first end EP1 of the third light emitting elements LD3 to contact the first end EP1 of the third light emitting elements LD3. That is, the third connection electrode ELT3 may electrically connect the second end EP2 of the second light emitting elements LD2 and the first end EP1 of the third light emitting elements LD3.

Similarly, the fourth connection electrode ELT4 may be directly located on the second end EP2 of the third light emitting elements LD3 to contact the second end EP2 of the third light emitting elements LD3. In addition, the fourth connection electrode ELT4 may be directly located on the first end EP1 of the fourth light emitting elements LD4 to contact the first end EP1 of the fourth light emitting elements LD4. That is, the fourth connection electrode ELT4 may electrically connect the second end EP2 of the third light emitting elements LD3 and the first end EP1 of the fourth light emitting elements LD4.

Similarly, the fifth connection electrode ELT5 may be directly located on the second end EP2 of the fourth light emitting elements LD4 to contact the second end EP2 of the fourth light emitting elements LD4.

The first connection electrode ELT1 may be electrically connected to the first electrode ALE1 through a contact hole passing through the first insulating layer INS1. The fifth connection electrode ELT5 may be electrically connected to the second electrode ALE2 through a contact hole passing through the first insulating layer INS1.

In one or more embodiments, the connection electrodes ELT may be configured of a plurality of conductive layers. For example, as shown in FIGS. 8 and 9, the first connection electrode ELT1, the third connection electrode ELT3, and the fifth connection electrode ELT5 may be located in the same layer. In addition, the second connection electrode ELT2 and the fourth connection electrode ELT4 may be located in the same layer. The first connection electrode ELT1, the third connection electrode ELT3, and the fifth connection electrode ELT5 may be located on the second insulating layer INS2. A third insulating layer INS3 may be located on the first connection electrode ELT1, the third connection electrode ELT3, and the fifth connection electrode ELT5. The second connection electrode ELT2 and the fourth connection electrode ELT4 may be located on the third insulating layer INS3.

As described above, when the third insulating layer INS3 is located between the connection electrodes ELT formed of different conductive layers, because the connection electrodes ELT may be stably separated by the third insulating layer INS3, electrical stability between the first and second ends EP1 and EP2 of the light emitting elements LD may be secured.

The third insulating layer INS3 may be configured of a single layer or multiple layers, and may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

In one or more other embodiments, the connection electrodes ELT may be configured of the same conductive layer. For example, as shown in FIGS. 13 and 14, the first to fifth connection electrodes ELT1, ELT2, ELT3, ELT4, and ELT5 may be located in the same layer. For example, the first to fifth connection electrodes ELT1, ELT2, ELT3, ELT4, and ELT5 may be concurrently or substantially simultaneously formed in the same process. As described above, when the connection electrodes ELT are concurrently or substantially simultaneously formed, the number of masks may be reduced, and a manufacturing process may be simplified.

The connection electrodes ELT may be formed of various transparent conductive materials. For example, the connection electrodes ELT may include at least one of various transparent conductive materials including indium tin oxide (ITO), indium zinc oxide (IZO), indium tin zinc oxide (ITZO), aluminum zinc oxide (AZO), gallium zinc oxide (GZO), zinc tin oxide (ZTO), or gallium tin oxide (GTO), and may be implemented to be substantially transparent or translucent to satisfy a light transmittance (e.g., predetermined light transmittance). Accordingly, light emitted from the first and second ends EP1 and EP2 of the light emitting elements LD may pass through the connection electrodes ELT and may be emitted to the outside of the display panel PNL.

Figure 15:
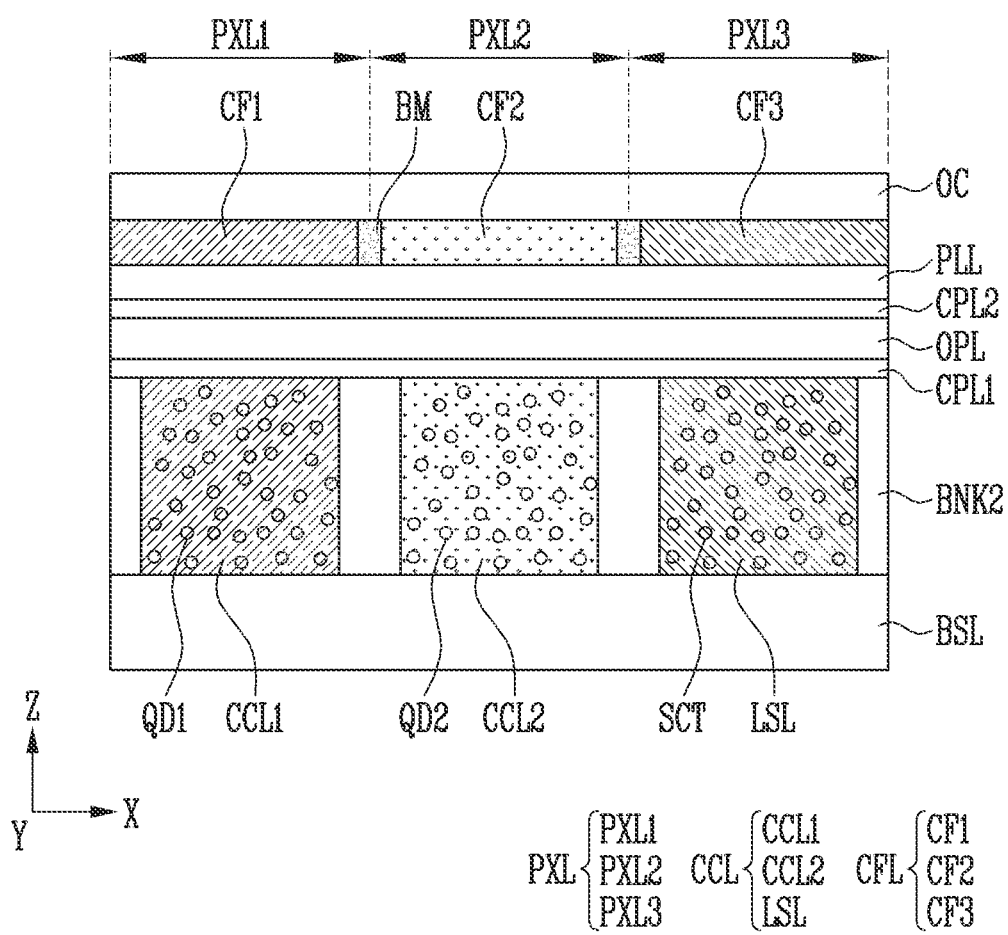
FIG. 15 is a cross-sectional view illustrating first to third pixels according to one or more embodiments.
Figure 16:
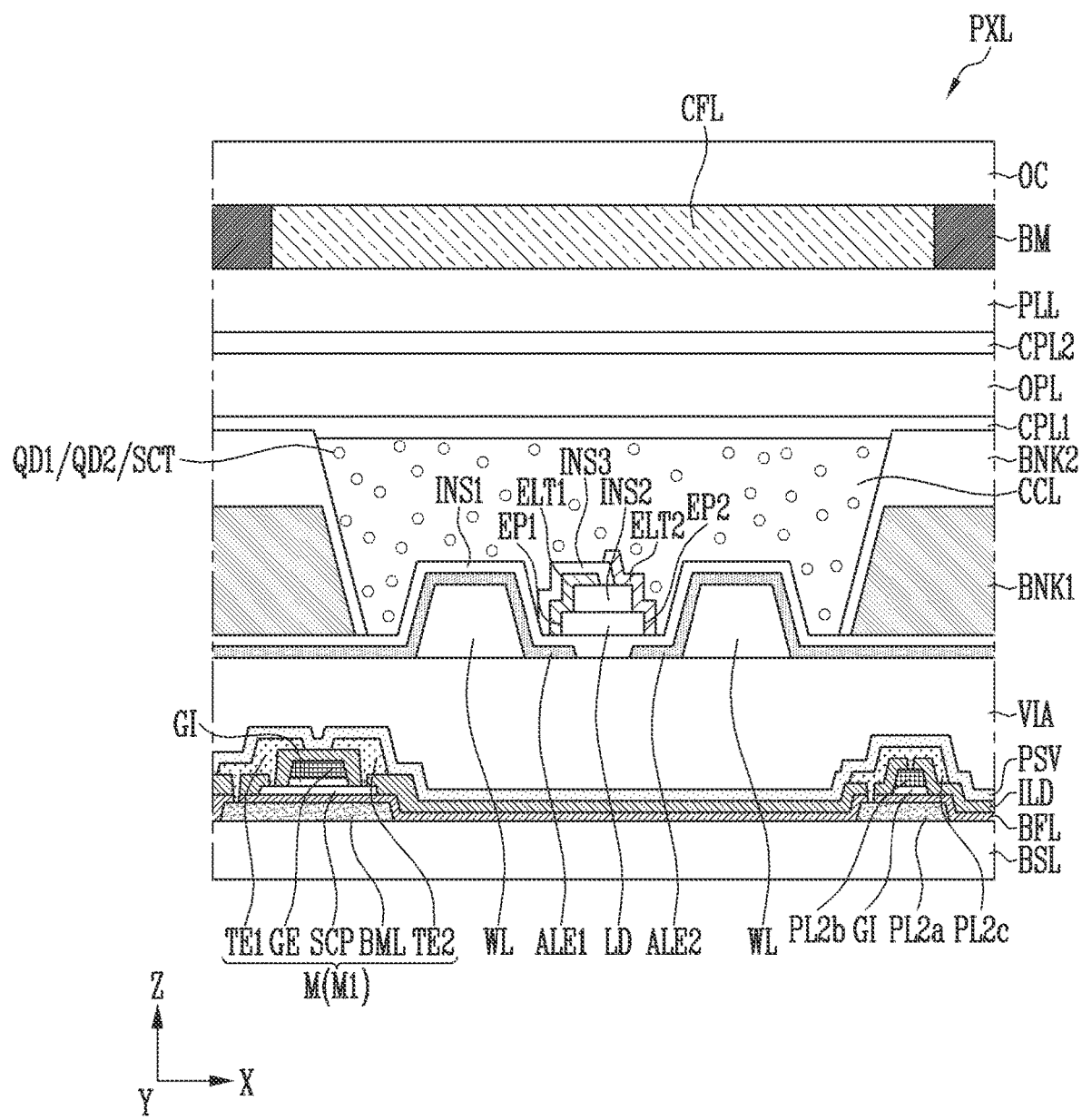
FIG. 16 is a cross-sectional view of a pixel according to one or more embodiments.

FIG. 15 is a cross-sectional view illustrating first to third pixels according to one or more embodiments. FIG. 16 is a cross-sectional view of a pixel according to one or more embodiments.

FIG. 15 shows a color conversion layer CCL, an optical layer OPL, a color filter layer CFL, and/or the like. In FIG. 15, a configuration except for the base layer BSL of FIGS. 8 to 14 is omitted for convenience of description. FIG. 16 illustrates a stack structure of the pixel PXL in relation to the color conversion layer CCL, the optical layer OPL, and/or the color filter layer CFL in detail.

Referring to FIGS. 15 and 16, a second bank BNK2 may be located on the above-described first bank BNK1. The second bank BNK2 may be located between, or at a boundary between, the first to third pixels PXL1, PXL2, and PXL3. The second bank BNK2 may include/define an opening overlapping each of the first to third pixels PXL1, PXL2, and PXL3. The opening of the second bank BNK2 may provide a space in which the color conversion layer CCL may be provided.

The color conversion layer CCL may be located on the light emitting elements LD in the opening of the second bank BNK2. The color conversion layer CCL may include a first color conversion layer CCL1 located in the first pixel PXL1, a second color conversion layer CCL2 located in the second pixel PXL2, and a scattering layer LSL located in the third pixel PXL3.

In one or more embodiments, the first to third pixels PXL1, PXL2, and PXL3 may include light emitting elements LD that emit light of the same color. For example, the first to third pixels PXL1, PXL2, and PXL3 may include light emitting elements LD emitting light of a third color (or blue). The color conversion layer CCL including color conversion particles may be located on each of the first to third pixels PXL1, PXL2, and PXL3 to display a full-color image.

The first color conversion layer CCL1 may include first color conversion particles that convert light of the third color emitted from the light emitting element LD into light of the first color. For example, the first color conversion layer CCL1 may include a plurality of first quantum dots QD1 dispersed in a matrix material (e.g., predetermined matrix material) such as a base resin.

In one or more embodiments, when the light emitting element LD is a blue light emitting element for emitting blue light and the first pixel PXL1 is a red pixel, the first color conversion layer CCL1 may include the first quantum dot QD1 that converts the blue light emitted from the blue light emitting element into red light. The first quantum dot QD1 may absorb the blue light, and may shift a wavelength according to an energy transition to emit the red light. Meanwhile, when the first pixel PXL1 is a pixel of a different color, the first color conversion layer CCL1 may include a first quantum dot QD1 corresponding to the color of the first pixel PXL1.

The second color conversion layer CCL2 may include second color conversion particles that convert light of the third color emitted from the light emitting element LD into light of the second color. For example, the second color conversion layer CCL2 may include a plurality of second quantum dots QD2 dispersed in a matrix material (e.g., predetermined matrix material) such as a base resin.

In one or more embodiments, when the light emitting element LD is the blue light emitting element for emitting the blue light and the second pixel PXL2 is a green pixel, the second color conversion layer CCL2 may include a second quantum dot QD2 that converts the blue light emitted from the blue light emitting element into green light. The second quantum dot QD2 may absorb the blue light, and may shift a wavelength according to an energy transition to emit the green light. Meanwhile, when the second pixel PXL2 is a pixel of a different color, the second color conversion layer CCL2 may include a second quantum dot QD2 corresponding to the color of the second pixel PXL2.

In one or more embodiments, an absorption coefficient of the first quantum dot QD1 and the second quantum dot QD2 may be increased by allowing the blue light having a relatively short wavelength in a visible light region to be incident on each of the first quantum dot QD1 and the second quantum dot QD2. Accordingly, finally, efficiency of light emitted from the first pixel PXL1 and the second pixel PXL2 may be improved, and excellent color reproducibility may be secured. In addition, manufacturing efficiency of the display device may be increased, by configuring the light emitting unit EMU of the first to third pixels PXL1, PXL2, and PXL3 using the light emitting elements LD of the same color (for example, the blue light emitting element).

The scattering layer LSL may be provided to efficiently use the light of the third color (or blue) emitted from the light emitting element LD. For example, when the light emitting element LD is the blue light emitting element for emitting the blue light and the third pixel PXL3 is the blue pixel, the scattering layer LSL may include at least one type of scatterer SCT in order to efficiently use the light emitted from the light emitting element LD. For example, the scatterer SCT of the scattering layer LSL may include at least one of barium sulfate ($BaSO_4$), calcium carbonate ($CaCO_3$), titanium oxide ($TiO_2$), silicon oxide ($SiO_2$), aluminum oxide ($Al_2O_3$), zirconium oxide ($ZrO_2$), and zinc oxide (ZnO). Meanwhile, the scatterer SCT may also be located in an area in addition to the third pixel PXL3, and may be selectively included in the first color conversion layer CCL1 or the second color conversion layer CCL2. According to one or more embodiments, the scatterer SCT may be omitted and the scattering layer LSL formed of a transparent polymer may be provided.

A first capping layer CPL1 may be located on the color conversion layer CCL. The first capping layer CPL1 may be provided over the first to third pixels PXL1, PXL2, and PXL3. The first capping layer CPL1 may cover the color conversion layer CCL. The first capping layer CPL1 may reduce or prevent the likelihood of an impurity, such as moisture or air, penetrating from the outside and damaging or contaminating the color conversion layer CCL.

The first capping layer CPL1 may be an inorganic layer, and may include silicon nitride ($SiN_x$), aluminum nitride ($AlN_x$), titanium nitride ($TiN_x$), silicon oxide ($SiO_x$), aluminum oxide ($AlO_x$), titanium oxide ($TiO_x$), silicon oxycarbide ($SiO_xC_y$), silicon oxynitride ($SiO_xN_y$), or the like.

The optical layer OPL may be located on the first capping layer CPL1. The optical layer OPL may serve to improve light extraction efficiency by recycling light provided from the color conversion layer CCL by total reflection. To this end, the optical layer OPL may have a relatively low refractive index compared to the color conversion layer CCL. For example, the refractive index of the color conversion layer CCL may be about 1.6 to about 2.0, and the refractive index of the optical layer OPL may be about 1.1 to about 1.3.

A second capping layer CPL2 may be located on the optical layer OPL. The second capping layer CPL2 may be provided over the first to third pixels PXL1, PXL2, and PXL3. The second capping layer CPL2 may cover the optical layer OPL. The second capping layer CPL2 may reduce or prevent the likelihood of an impurity, such as moisture or air, penetrating from the outside and damaging or contaminating the optical layer OPL.

The second capping layer CPL2 may be an inorganic layer, and may include silicon nitride (SiNx), aluminum nitride (AlNx), titanium nitride (TiNx), silicon oxide (SiOx), aluminum oxide (AlOx), titanium oxide (TiOx), silicon oxycarbide (SiOxCy), silicon oxynitride (SiOxNy), or the like.

A planarization layer PLL may be located on the second capping layer CPL2. The planarization layer PLL may be provided over the first to third pixels PXL1, PXL2, and PXL3.

The planarization layer PLL may include an organic material such as an acrylates resin, an epoxy resin, a phenolic resin, a polyam ides resin, a polyim ides resin, a polyesters resin, a polyphenylenesulfides resin, or benzocyclobutene (BCB). However, the disclosure is not limited thereto, and the planarization layer PLL may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

The color filter layer CFL may be located on the planarization layer PLL. The color filter layer CFL may include color filters CF1, CF2, and CF3 matching the colors of each pixel PXL. As the color filters CF1, CF2, and CF3 matching the colors of each of the first to third pixels PXL1, PXL2, and PXL3 are located, the full-color image may be displayed.

The color filter layer CFL may include the first color filter CF1 located in the first pixel PXL1 to selectively transmit light emitted from the first pixel PXL1, the second color filter CF2 located in the second pixel PXL2 to selectively transmit light emitted from the second pixel PXL2, and the third color filter CF3 located in the third pixel PXL3 to selectively transmit light emitted from the third pixel PXL3.

In one or more embodiments, the first color filter CF1, the second color filter CF2, and the third color filter CF3 may be a red color filter, a green color filter, and a blue color filter, respectively, but are not limited thereto. Hereinafter, when any color filter among the first color filter CF1, the second color filter CF2, and the third color filter CF3 is referenced, or when two or more types of color filters are collectively referenced, the any color filter or the two or more types of color filters may be referred to as a "color filter CF" or "color filters CF."

The first color filter CF1 may overlap the first color conversion layer CCL1 in the third direction (Z-axis direction). The first color filter CF1 may include a color filter material that selectively transmits the light of the first color (or red). For example, when the first pixel PXL1 is the red pixel, the first color filter CF1 may include a red color filter material.

The second color filter CF2 may overlap the second color conversion layer CCL2 in the third direction (Z-axis direction). The second color filter CF2 may include a color filter material that selectively transmits the light of the second color (or green). For example, when the second pixel PXL2 is the green pixel, the second color filter CF2 may include a green color filter material.

The third color filter CF3 may overlap the scattering layer LSL in the third direction (Z-axis direction). The third color filter CF3 may include a color filter material that selectively transmits the light of the third color (or blue). For example, when the third pixel PXL3 is the blue pixel, the third color filter CF3 may include a blue color filter material.

According to one or more embodiments, a light-blocking layer BM may be further located among the first to third color filters CF1, CF2, and CF3. As described above, the light-blocking layer BM is formed among the first to third color filters CF1, CF2, and CF3, a color mixture defect visually recognized from a front or side of the display device. A material of the light-blocking layer BM is not particularly limited, and may be formed of various light-blocking materials. For example, the light-blocking layer BM may be implemented by stacking the first to third color filters CF1, CF2, and CF3 on each other.

An overcoat layer OC may be located on the color filter layer CFL. The overcoat layer OC may be provided over the first to third pixels PXL1, PXL2, and PXL3. The overcoat layer OC may cover a lower member including the color filter layer CFL. The overcoat layer OC may reduce or prevent the likelihood of moisture or air penetrating into the above-described lower member. In addition, the overcoat layer OC may protect the above-described lower member from a foreign substance such as dust.

The overcoat layer OC may include an organic material such as an acrylates resin, an epoxy resin, a phenolic resin, a polyam ides resin, a polyim ides resin, a polyesters resin, a polyphenylenesulfides resin, or benzocyclobutene (BCB). However, the disclosure is not limited thereto, and the planarization layer PLL may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

Those skilled in the art may understand that the disclosure may be implemented in a modified form without departing from the above-described essential characteristic. Therefore, the disclosed methods should be considered in a description point of view not a limitation point of view. The scope of the disclosure is shown in the claims not in the above description, and all differences within the scope will be construed as being included in the disclosure.

What is claimed is:
1. A display device comprising:
pixels;
electrodes in an emission area of the pixels, and spaced apart from each other;
light emitting elements between the electrodes;
connection electrodes on the light emitting elements, and comprising a first electrode portion, a second electrode portion, and a connection portion between the first electrode portion and the second electrode portion, the first electrode portion, the second electrode portion, and the connection portion being integrally provided; and a bank pattern in a non-emission area, and overlapping the connection portion.

2. The display device according to claim 1, wherein the emission area comprises a first emission area and a second emission area, and wherein the non-emission area is between the first emission area and the second emission area.

3. The display device according to claim 2, wherein the light emitting elements comprise a first light emitting element in the first emission area, and a second light emitting element in the second emission area.

4. The display device according to claim 3, wherein the first electrode portion is electrically connected to the first light emitting element, and wherein the second electrode portion is electrically connected to the second light emitting element.

5. The display device according to claim 2, wherein the first electrode portion overlaps the first emission area, and wherein the second electrode portion overlaps the second emission area.

6. The display device according to claim 1, further comprising a first bank surrounding the emission area.

7. The display device according to claim 6, wherein a thickness of the first bank is greater than a thickness of the bank pattern.

8. The display device according to claim 6, wherein the first bank is between the pixels.

9. The display device according to claim 6, wherein the first bank and the bank pattern are in a same layer.

10. The display device according to claim 6, wherein the first bank and the bank pattern are integrally provided.

11. A display device comprising:

a first light emitting element in a first emission area;

a second light emitting element in a second emission area;

a first bank pattern between the first emission area and the second emission area;

a first electrode portion on the first light emitting element;

a second electrode portion on the second light emitting element; and a connection portion between the first electrode portion and the second electrode portion, and overlapping the first bank pattern.

12. The display device according to claim 11, further comprising a first bank surrounding the first emission area and the second emission area.

13. The display device according to claim 12, wherein a thickness of the first bank is greater than a thickness of the first bank pattern.

14. The display device according to claim 12, further comprising a second bank pattern between the first bank and the first emission area.

15. The display device according to claim 14, wherein a thickness of the first bank pattern and a thickness of the second bank pattern are the same.

16. The display device according to claim 14, wherein a thickness of the first bank is greater than a thickness of the second bank pattern.

17. The display device according to claim 14, wherein the first bank pattern and the second bank pattern are in a same layer.

18. The display device according to claim 14, wherein the first bank pattern and the second bank pattern comprise a same material.

19. The display device according to claim 18, further comprising a third bank pattern between the first bank and the second emission area.

* * * * *